(12) United States Patent
Yang et al.

(10) Patent No.: US 11,094,791 B1
(45) Date of Patent: Aug. 17, 2021

(54) VERTICAL TRANSISTOR DEVICE WITH SOURCE/DRAIN REGIONS COMPRISING A TWI-DIMENSIONAL (2D) MATERIAL AND METHODS OF MAKING SUCH VERTICAL TRANSISTOR DEVICES

(71) Applicant: GLOBALFOUNDRIES U.S. Inc., Santa Clara, CA (US)

(72) Inventors: Heng Yang, Rexford, NY (US); David Pritchard, Glenville, NY (US); Kai Sun, Clifton Park, NY (US); Hongru Ren, Mechanicville, NY (US); Neha Nayyar, Clifton Park, NY (US); Manjunatha Prabhu, Clifton Park, NY (US); Elizabeth Strehlow, Malta, NY (US); Salvatore Cimino, Waterford, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/776,711

(22) Filed: Jan. 30, 2020

(51) Int. Cl.
| | |
|---|---|
| *H01L 29/47* | (2006.01) |
| *H01L 29/417* | (2006.01) |
| *H01L 29/16* | (2006.01) |
| *H01L 29/66* | (2006.01) |
| *H01L 29/78* | (2006.01) |
| *H01L 29/08* | (2006.01) |

(52) U.S. Cl.
CPC .... *H01L 29/41741* (2013.01); *H01L 29/0847* (2013.01); *H01L 29/16* (2013.01); *H01L 29/66666* (2013.01); *H01L 29/7827* (2013.01)

(58) Field of Classification Search
CPC ............... H01L 29/41741; H01L 29/16; H01L 29/7827; H01L 29/66666; H01L 29/0847; H01L 27/11553–11556; H01L 27/1158–11582; H01L 27/11273; H01L 29/66712–66734; H01L 29/7802–7815
USPC ...................................................... 257/330
See application file for complete search history.

(56) References Cited

U.S. PATENT DOCUMENTS 5,920,088 A * 7/1999 Augusto ......... H01L 21/823885
257/192
6,013,930 A 1/2000 Yamazaki et al.
(Continued)

OTHER PUBLICATIONS

Massachusetts Institute of Technology, "Insulator or superconductor? Physicists find graphene is both," Science News, Public Release, Mar. 5, 2018.

(Continued)

*Primary Examiner* — Mohammad M Hoque
(74) *Attorney, Agent, or Firm* — Hoffman Warnick LLC

(57) ABSTRACT

One illustrative device disclosed herein includes a bottom source/drain region and a top source/drain region positioned vertically above at least a portion of the bottom source/drain region, wherein each of the bottom source/drain region and the top source/drain region comprise at least one layer of a two-dimensional (2D) material. The device also includes a substantially vertically oriented semiconductor structure positioned vertically between the bottom source/drain region and the top source/drain region and a gate structure positioned all around an outer perimeter of the substantially vertically oriented semiconductor structure for at least a portion of the vertical height of the substantially vertically oriented semiconductor structure.

20 Claims, 21 Drawing Sheets

(56) References Cited

U.S. PATENT DOCUMENTS

| | | | |
|---|---|---|---|
| 6,150,231 | A | 11/2000 | Muller et al. |
| 7,205,639 | B2 | 4/2007 | Hierlemann et al. |
| 2013/0307513 | A1* | 11/2013 | Then ................. H01L 21/02636 323/311 |
| 2014/0170821 | A1* | 6/2014 | Nyhus ............... H01L 21/02532 438/268 |
| 2015/0303270 | A1 | 10/2015 | Liaw |
| 2017/0179263 | A1* | 6/2017 | Pourtois ................ H01L 29/778 |
| 2018/0093454 | A1 | 4/2018 | Kaner et al. |
| 2018/0205038 | A1 | 7/2018 | Kim et al. |
| 2019/0070840 | A1 | 3/2019 | Hemnani et al. |
| 2019/0198669 | A1* | 6/2019 | Park ................... H01L 29/0847 |
| 2020/0350440 | A1 | 11/2020 | Gao et al. |
| 2021/0013108 | A1* | 1/2021 | Wu ................... H01L 29/66666 |

OTHER PUBLICATIONS

U.S. Appl. No. 16/776,636, Office Action dated Apr. 28, 2021, (GFF-0539-US), 17 pgs.

* cited by examiner

US 11,094,791 B1

VERTICAL TRANSISTOR DEVICE WITH SOURCE/DRAIN REGIONS COMPRISING A TWI-DIMENSIONAL (2D) MATERIAL AND METHODS OF MAKING SUCH VERTICAL TRANSISTOR DEVICES

BACKGROUND

Field of the Invention

The present disclosure generally relates to various novel embodiments of a vertical transistor device with source/drain regions comprising at least one layer of a two-dimensional (2D) material and methods of making such vertical transistor devices.

Description of the Related Art

Within the electronics industry, there is a constant demand for reducing the size of semiconductor devices while at the same time improving their performance capabilities. Relatively recently, materials that are generally known as two-dimensional (2D) materials have been developed and investigated for use in integrated circuit products. In general, a 2D material is a material having a single-layer structure in which atoms form a predetermined crystal structure. The atoms or molecules within such a single layer of 2D material are bonded together through intermolecular forces (e.g., covalent bonds). Adjacent layers of 2D materials of a stacked structure are coupled to one another through one or more intermolecular forces (e.g., Van der Waals forces). Many of the intrinsic electronic, thermal, optical and mechanical properties of such 2D materials, such as graphene, exceed, in isolation or combination, that of other materials commonly used in the manufacture of integrated circuit products and various semiconductor devices, such as transistors. For example, depending on their chemical structure, single-sheet 2D materials may possess many beneficial properties, such as high mechanical strength, high electronic and thermal conductivity, and/or unique quantum-mechanical effects, etc.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

In general, prior art vertical transistor devices comprise a generally vertically oriented channel semiconductor structure that extends upward from a front surface of a semiconductor substrate. Such a vertical transistor device further comprises a channel region, a gate-all-around (GAA) gate structure that is positioned around the perimeter of the channel region in the vertically oriented channel semiconductor structure, a bottom source/drain (S/D) region, a top S/D region, a bottom spacer, and a top spacer. A bottom source/drain contact is formed to conductively contact the bottom S/D region, a top source/drain contact is formed to conductively contact the top S/D region and a gate contact is formed to conductively contact the gate structure. The gate structure typically comprises a gate insulation layer and a conductive gate electrode. The gate structure may be manufactured using well-known gate-first or replacement gate manufacturing techniques.

The present disclosure is generally directed to various novel embodiments of a vertical transistor device with source/drain regions comprising at least one layer of a two-dimensional (2D) material and methods of making such vertical transistor devices.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a vertical transistor device with source/drain regions comprising at least one layer of a two-dimensional (2D) material and methods of making such vertical transistor devices. One illustrative device disclosed herein includes a bottom source/drain region and a top source/drain region positioned vertically above at least a portion of the bottom source/drain region, wherein each of the bottom source/drain region and the top source/drain region comprises at least one layer of a two-dimensional (2D) material. The device also includes a substantially vertically oriented semiconductor structure positioned vertically between the bottom source/drain region and the top source/drain region and a gate structure positioned all around an outer perimeter of the substantially vertically oriented semiconductor structure for at least a portion of the vertical height of the substantially vertically oriented semiconductor structure.

BRIEF DESCRIPTION OF THE DRAWINGS

The disclosure may be understood by reference to the following description taken in conjunction with the accompanying drawings, in which like reference numerals identify like elements, and in which.

Figure 1:
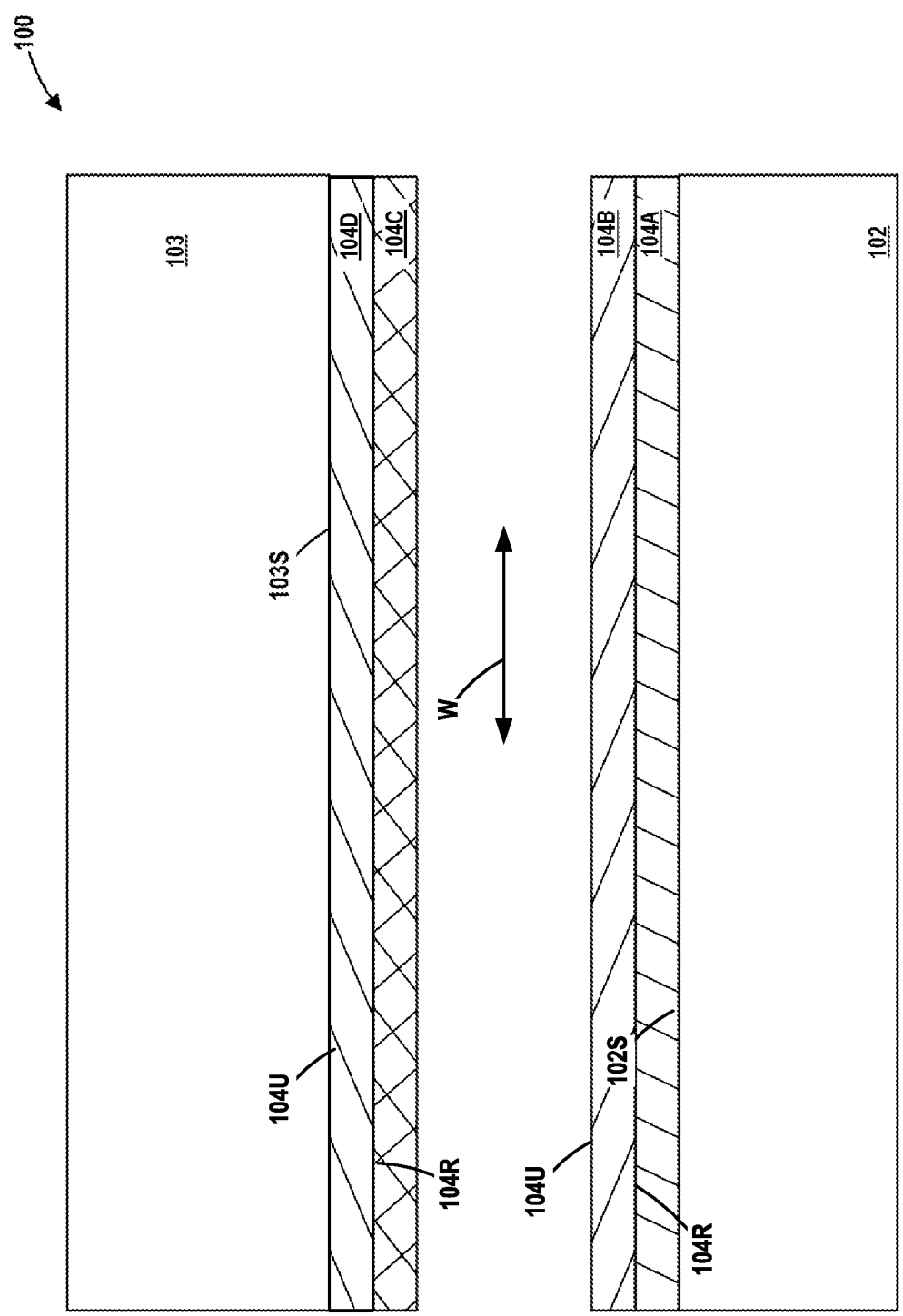
FIGS. 1-24 depict various novel embodiments of a vertical transistor device with source/drain regions comprising at least one layer of a two-dimensional (2D) material and methods of making such vertical transistor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-24 depict various novel embodiments of a vertical transistor device 100 with source/drain regions comprising at least one layer of a two-dimensional (2D) material and methods of making such vertical transistor devices. As will be appreciated by those skilled in the art after a complete reading of the present application, the vertical transistor device 100 disclosed herein may be an N-type or P-type device and it may be formed on a bulk semiconductor substrate or a semiconductor-on-insulator substrate. Additionally, the gate structure of the vertical transistor device 100 may be manufactured using known gate-first or replacement gate manufacturing techniques. For purposes of disclosure only, the gate structure of the vertical transistor device 100 is formed by performing known replacement gate manufacturing techniques. However, as noted above, the various inventions disclosed herein should not be considered to be limited to the particular examples shown in the attached drawings and described below.

FIG. 1 depicts one illustrative embodiment of a vertical transistor device 100 disclosed herein at an early stage of fabrication. As shown therein, a first semiconductor substrate 102, with a plurality of 2D material layers 104A-104B formed above a surface 102S thereof, is positioned opposite a second semiconductor substrate 103, with a plurality of 2D material layers 104C-104D formed above a surface 103S thereof. The 2D material layers 104A-104D will be collectively referenced using the numeral 104. The number of the 2D material layers 104 formed on each of the substrates 102, 103 may vary depending upon the particular application, and the number of 2D material layers 104 formed on each of the substrates 102, 103 need not be the same, but that may be the case in some applications. In other applications, only a single 2D material layer 104 may be formed on one of the substrates 102, 103 while the other of the substrates 102, 103 has a plurality of 2D material layers 104 formed thereon, e.g., the substrate 102 may have a single 2D material layer 104 formed thereon while the substrate 103 may have five 2D material layers 104 formed thereon. In another embodiment, all of the 2D material layers 104 may be formed on one of the substrates 102, 103, while the other of the substrates 102, 103 may have no 2D material layers 104 formed thereon. In this latter case, the substrate without any 2D material layers 104 would be bonded to the uppermost 2D material layer 104 formed on the other substrate.

The substrates 102, 103 may have a bulk configuration (as depicted in FIG. 1) or a semiconductor-on-insulator or silicon-on-insulator (SOI) configuration (not shown) that includes a base semiconductor layer, a buried insulation layer (e.g., silicon dioxide), and an active layer (e.g., silicon), wherein semiconductor devices are formed in and above the active layer. The substrates 102, 103 may be made of silicon or it may be made of semiconductor materials other than silicon and they may be formed to any desired thickness. Additionally, the substrates 102, 103 need not be made of the same material or have the same thickness, but that may the case in some applications. Thus, the terms "substrate" or "semiconductor substrate" should be understood to cover all semiconducting materials and all forms of such semiconductor materials.

As will be appreciated by those skilled in the art after a complete reading of the present application, the 2D material layers 104 disclosed herein may be formed using any known technique for the formation of such 2D material layers 104. For example, the 2D material layers 104 disclosed herein (or vertical stacks of such layers) may be formed using the methods disclosed in US patent applications 20190070840, 20180093454 or 20180205038, the entirety of each of these patent applications is hereby incorporated by reference. Additionally, the 2D material layers 104 disclosed herein (or vertical stacks of such layers) may be produced by layer formation and cleaving techniques that are similar to known techniques for forming SOI substrates which are also incorporated herein. Each of the 2D material layers 104 disclosed herein is a material having a single-layer structure in which the atoms or molecules of the layer 104 form a predetermined crystalline structure. The 2D material layers 104 disclosed herein may comprise a variety of materials, e.g., silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, $ReSe_2$, etc.

In some embodiments, as described more fully below, the 2D material layers 104 disclosed herein may be formed such that the crystalline structure of adjacent layers of the 2D material layers 104 may be rotated (clockwise or counter-clockwise) relative to one another. Such rotated 2D material layers 104 may be formed using any technique known in the art, including, for example, the method disclosed in the above-referenced US patent application 20180205038. The thickness of each of the 2D material layers 104 disclosed herein may vary depending upon the particular application, e.g., 1-100 nm. In the case where multiple 2D material layers 104 are arranged in a vertically oriented stack, the thickness and/or material of composition for each of the 2D material layers 104 within the stack may be different from one another. In some applications, all of the 2D material layers 104 in a particular stack of such layers may all have the same approximate thickness and they all may be comprised of the same material, but that may not be the case in all applications. If desired, during the process of forming the 2D material layers 104, N-type or P-type dopant materials may be added to each of the 2D material layers 104, i.e., the 2D material layers 104, in situ. In some applications, all of the 2D material layers 104 in a particular stack of such layers may be doped with the same type of dopant (e.g., N or P), but that may not be the case in all applications. Of course, if desired, and depending upon the particular application, some or all of the 2D material layers 104 disclosed herein may be initially formed in a substantially un-doped condition and dopant material may be subsequently implanted into the 2D material layers 104 disclosed herein.

In one illustrative process flow, the 2D material layers 104 disclosed herein are continuous layers of material that have a three dimensional configuration, i.e., a width in the direction W and length (into and out of the plane of the drawing page) and a substantially uniform vertical thickness in a direction that is substantially normal to the surfaces 102S, 103S of the substrates 102, 103, respectively, across the entire length and width of the 2D material layer 104. In one illustrative embodiment, each of the 2D material layers 104 disclosed herein are continuous sheets of material(s) that have a substantially planar surface 104U and a substantially planar surface 104R. The substantially planar surface 104U and the substantially planar surface 104R of each of the 2D material layers may be substantially parallel to one another and both surfaces may be substantially continuous across the entire length and width of the 2D material layer 104 at this point in the process flow.

Figure 2:
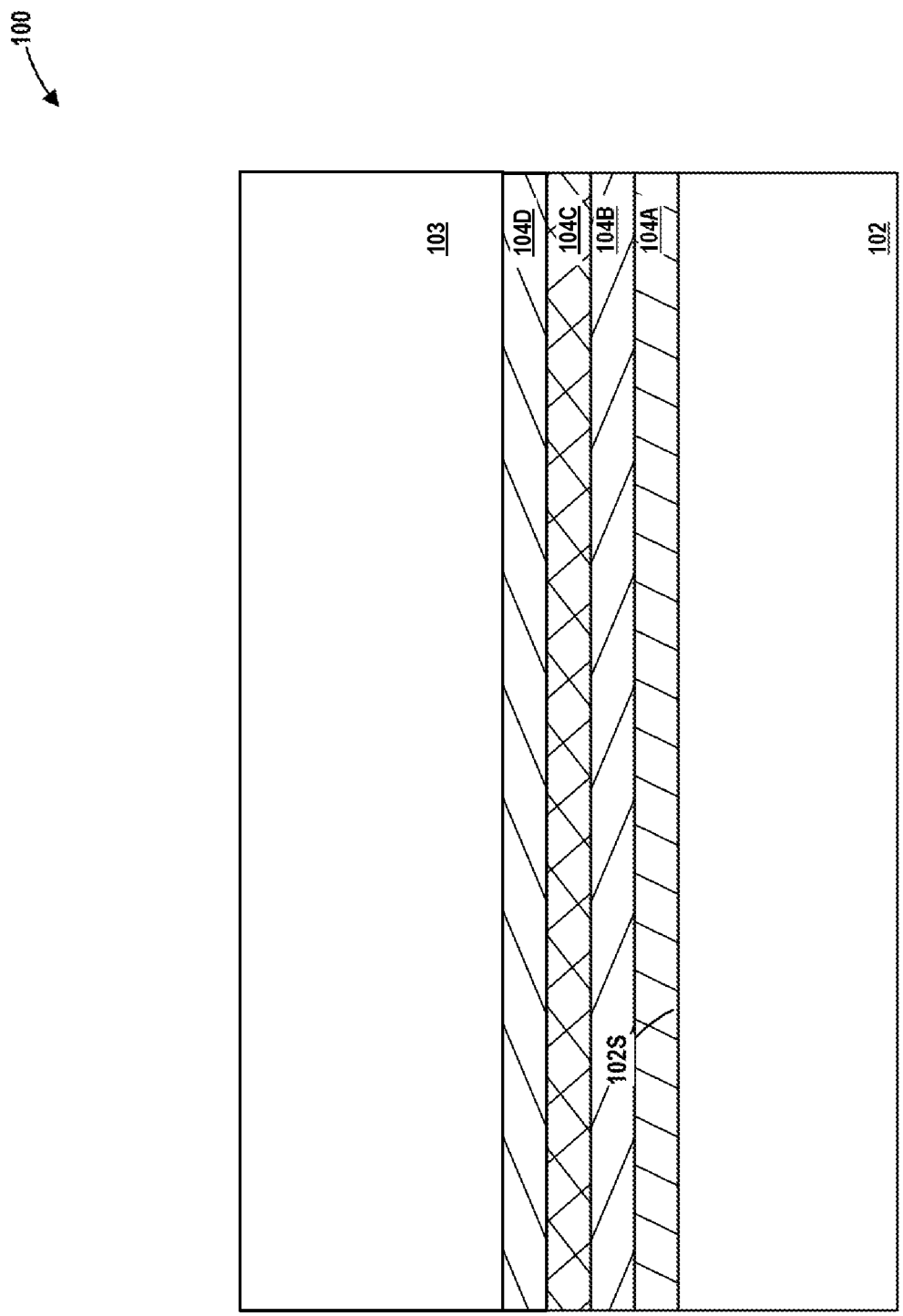

FIG. 2 depicts the vertical transistor device 100 after the substrates 102, 103 have been bonded to one another using known manufacturing techniques. More specifically, the 2D material layer 104B on the substrate 102 was bonded to the 2D material layer 104C on the substrate 103. In other applications, the features may be encapsulated with deposited layers of material if the Van der Waals bonding does not provide sufficient mechanical strength.

Figure 3:
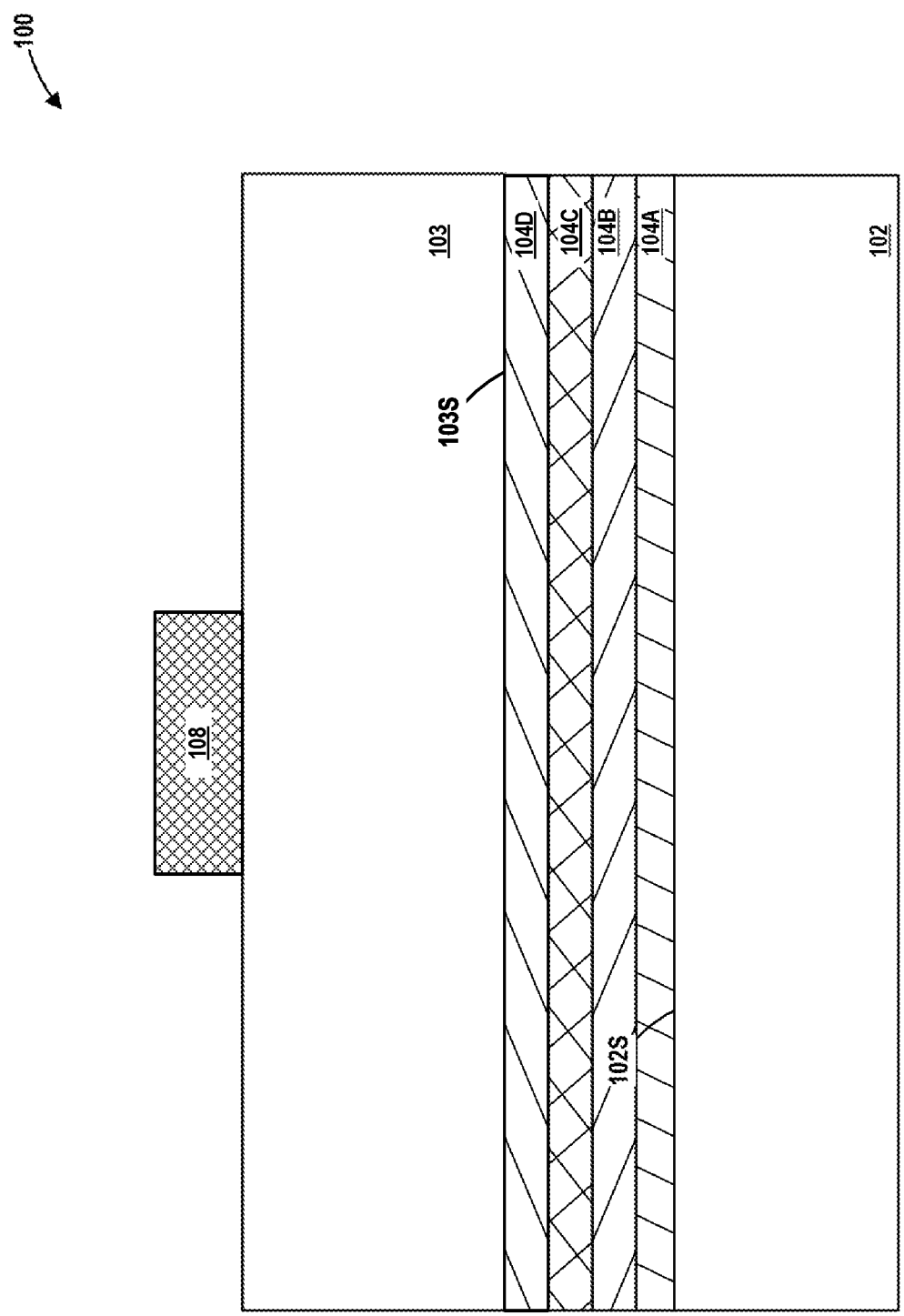

FIG. 3 depicts the vertical transistor device 100 after a patterned etch mask 108 was formed above the substrate 103. In one illustrative example, the patterned etch mask 108 may be a patterned layer of photoresist or OPL. In other applications, the patterned etch mask 108 may be a patterned hard mask that is comprised of, for example, silicon nitride. Such a patterned hard mask may be formed by performing known deposition, masking and etching techniques.

Figure 4:
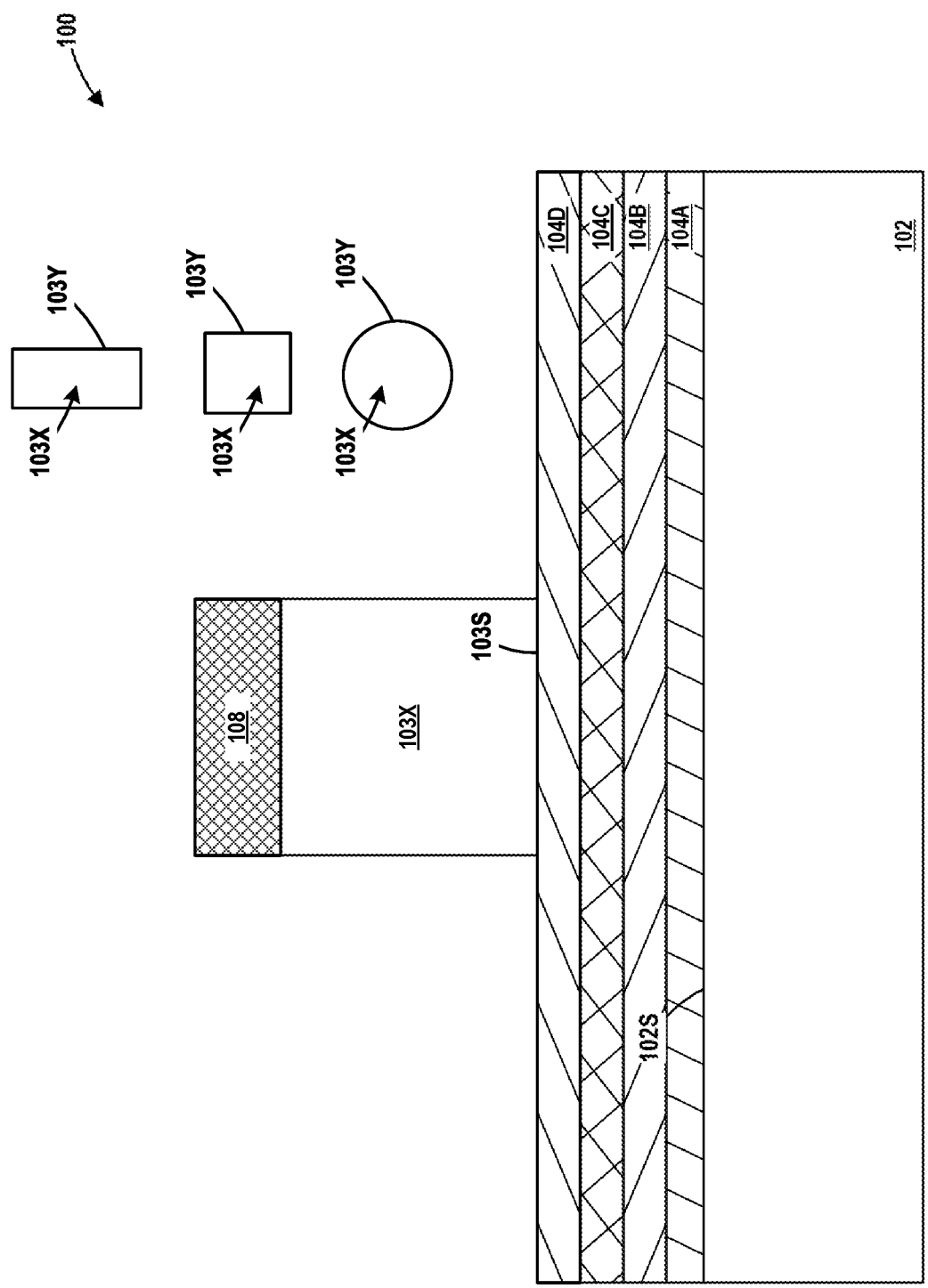

FIG. 4 depicts the vertical transistor device 100 after one or more etching processes were performed through the patterned etch mask 108 to pattern the substrate 103. This results in the formation of a substantially vertically oriented substrate structure 103X. As will be appreciated by those skilled in the art after a complete reading of the present application, a portion of the vertical height of the substrate structure 103X will become the channel region of the completed vertical transistor device 100. As indicated in the right-hand portion of FIG. 4, when viewed from above, the substantially vertically oriented substrate structure 103X may have a variety of different configurations, e.g., circular, rectangular, square, etc., and the substantially vertically oriented substrate structure 103X has an outer perimeter 103Y.

Figure 5:
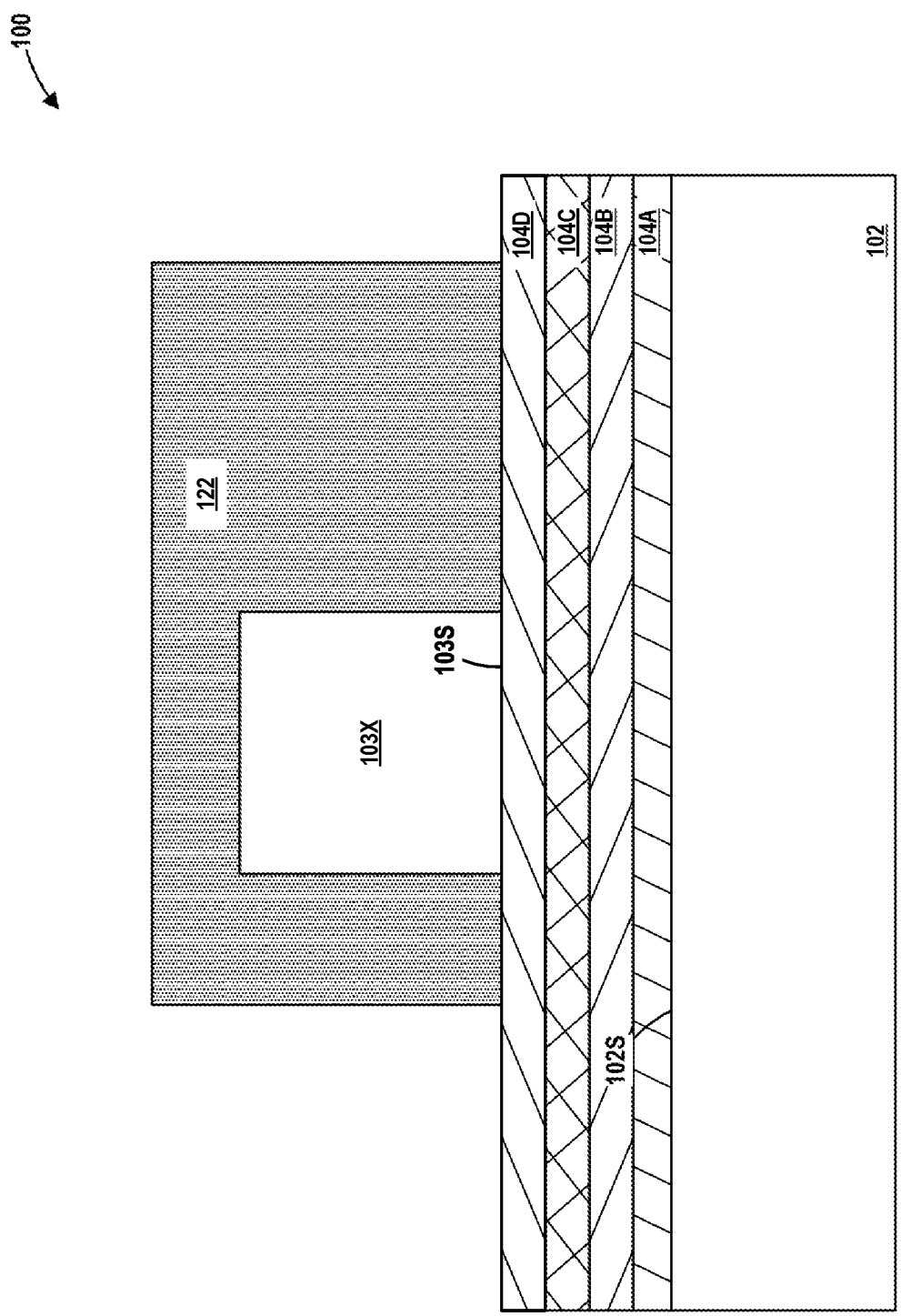

FIG. 5 depicts the vertical transistor device 100 after several process operations were performed. First, the patterned etch mask 108 was removed. Thereafter, another patterned etch mask 122 was formed on the product. The patterned etch mask 122 may be made of the materials discussed above with respect to the patterned etch mask 108.

Figure 6:
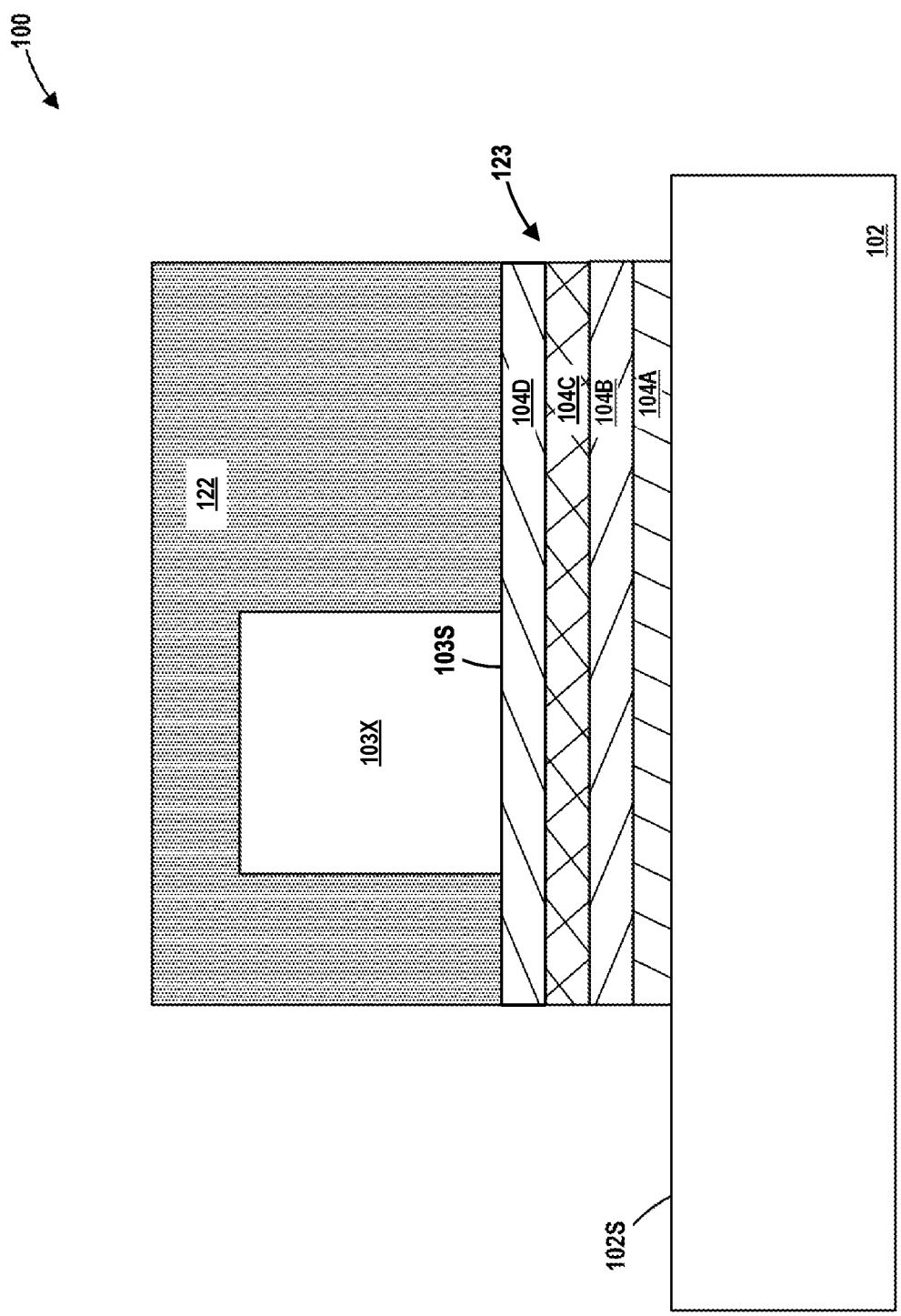

FIG. 6 depicts the vertical transistor device 100 after one or more etching processes were performed through the patterned etch mask 122 to pattern the 2D material layers 104A-D. As will be appreciated by those skilled in the art after a complete reading of the present application, the patterned 2D material layers 104A-D will become at least a portion of the bottom source/drain region 123 for the vertical transistor device 100. At this point in the process flow, bottom source/drain region 123 (i.e., the patterned 2D material layers 104) may have a variety of different configurations when viewed from above, e.g., circular, rectangular, square, etc.

Figure 7:
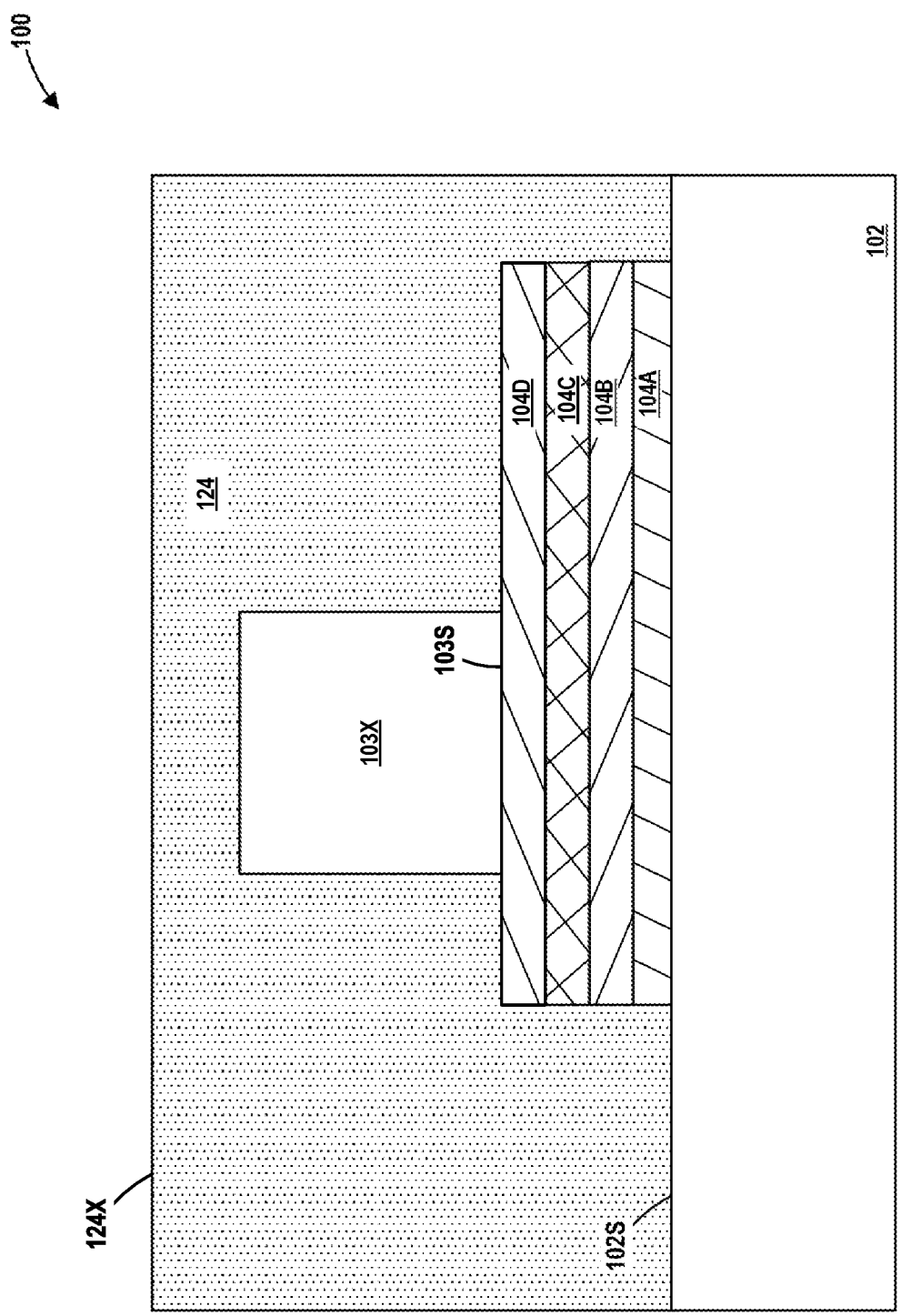

FIG. 7 depicts the vertical transistor device 100 after several process operations were performed. First, the patterned etch mask 122 was removed. Then, a layer of insulating material 124 was formed on the product and its upper surface 124X was planarized by performing a chemical mechanical planarization (CMP) process. The layer of insulating material 124 may be comprised of a variety of different materials, e.g., silicon nitride, a low-k insulating material (k value of 7 or less), silicon dioxide, etc.

Figure 8:
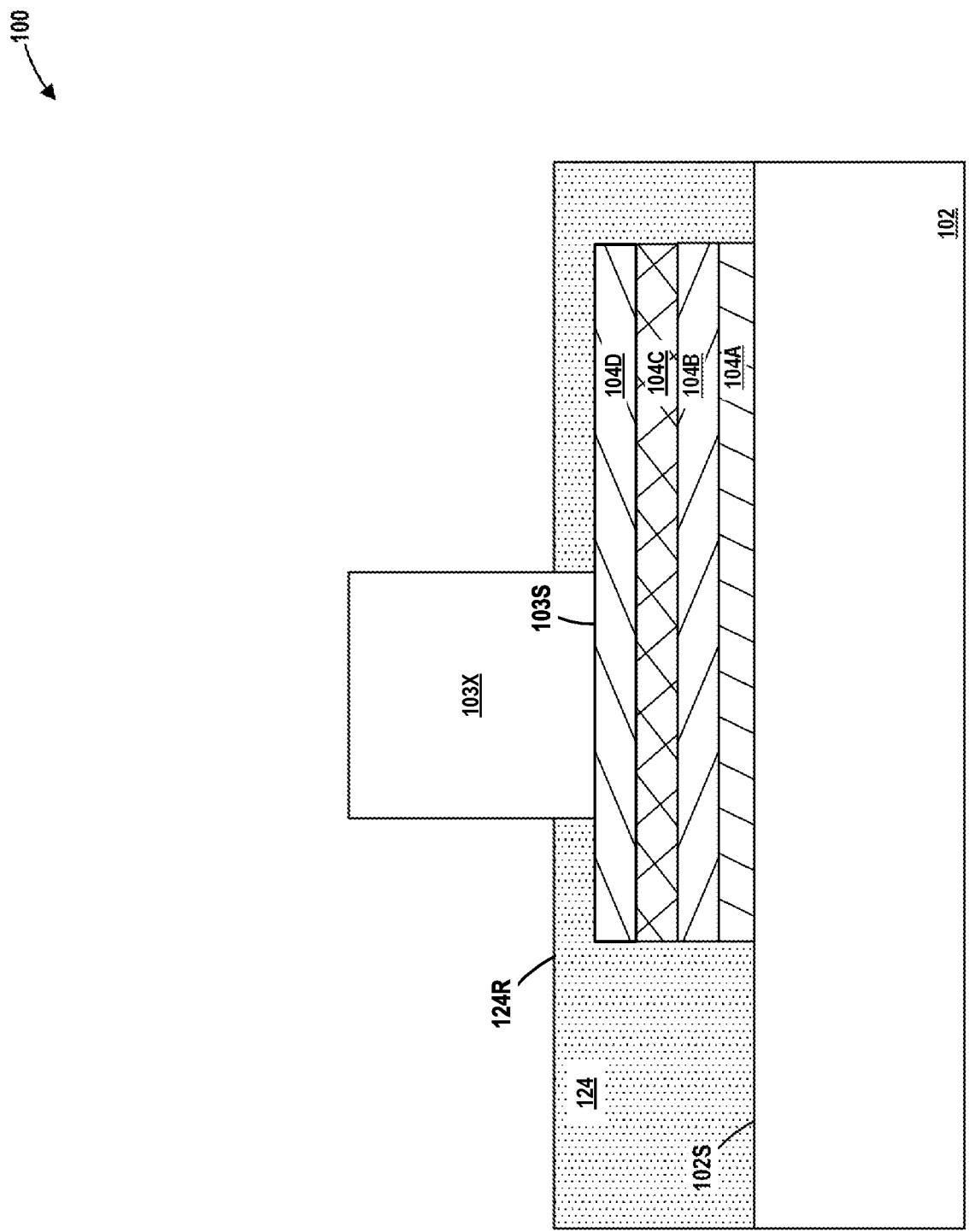

FIG. 8 depicts the vertical transistor device 100 after a timed recess etching process was performed to recess the layer of insulating material 124 to a desired residual vertical thickness. A portion of the recessed layer of insulating material 124 will function as a bottom spacer for the vertical transistor device 100. After this etching process, the recessed layer of insulating material 124 has a recessed upper surface 124R.

Figure 9:
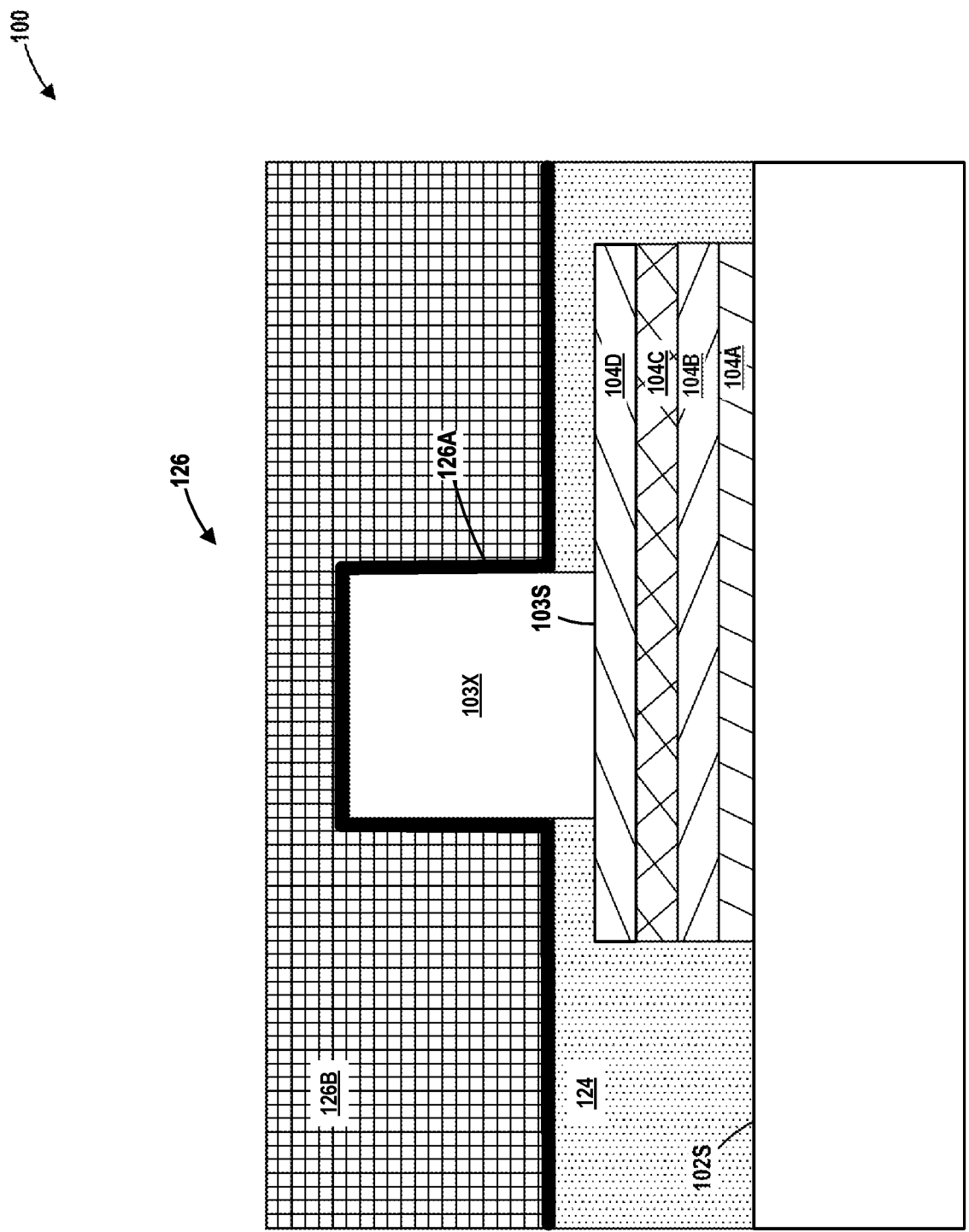

In the illustrative example depicted herein, the gate structure for the vertical transistor device 100 will be formed by performing well known gate-first manufacturing techniques. However, as will be appreciated by those skilled in the art after a complete reading of the present application, the gate structure for the vertical transistor device 100 disclosed herein may also be formed by performing well-known replacement gate manufacturing techniques. Accordingly, FIG. 9 depicts the vertical transistor device 100 after representative gate structure materials 126 have been formed on the product. The gate structure materials 126 normally comprise a conformal gate insulation layer 126A, such as silicon dioxide or a high-k (k value greater than 10) insulating material, and one or more layers of conductive material 126B that act as the gate electrode, e.g., a metal, a metal alloy, titanium nitride, tantalum nitride, tungsten, aluminum, polysilicon, etc.

Figure 10:
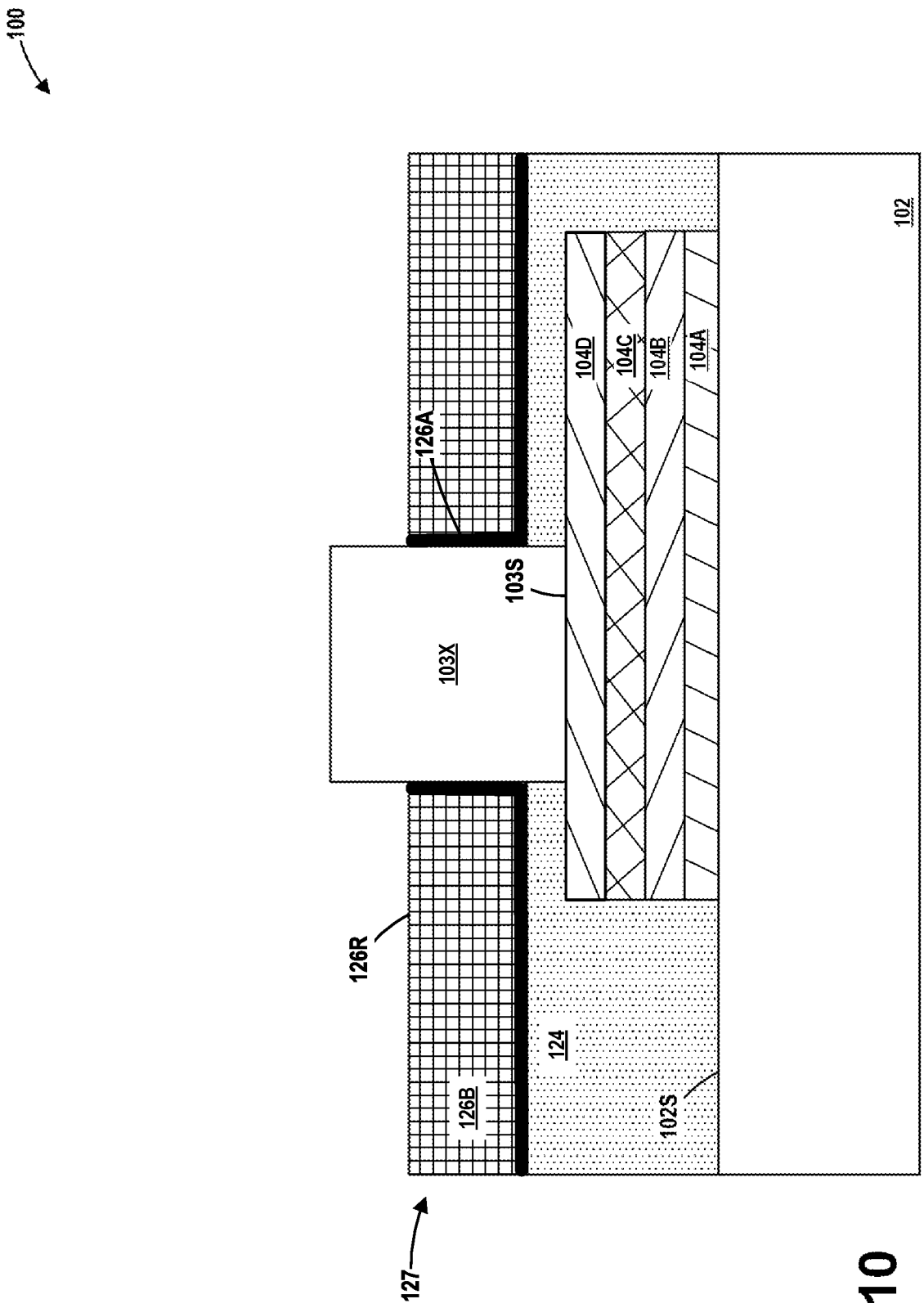

FIG. 10 depicts the vertical transistor device 100 after one or more timed recess etching processes were performed to recess the conformal gate insulation layer 126A and the one or more layers of conductive material 126B to a desired residual vertical thickness. After this process is completed, the one or more layers of conductive material 126B have a recessed upper surface 126R.

Figure 11:
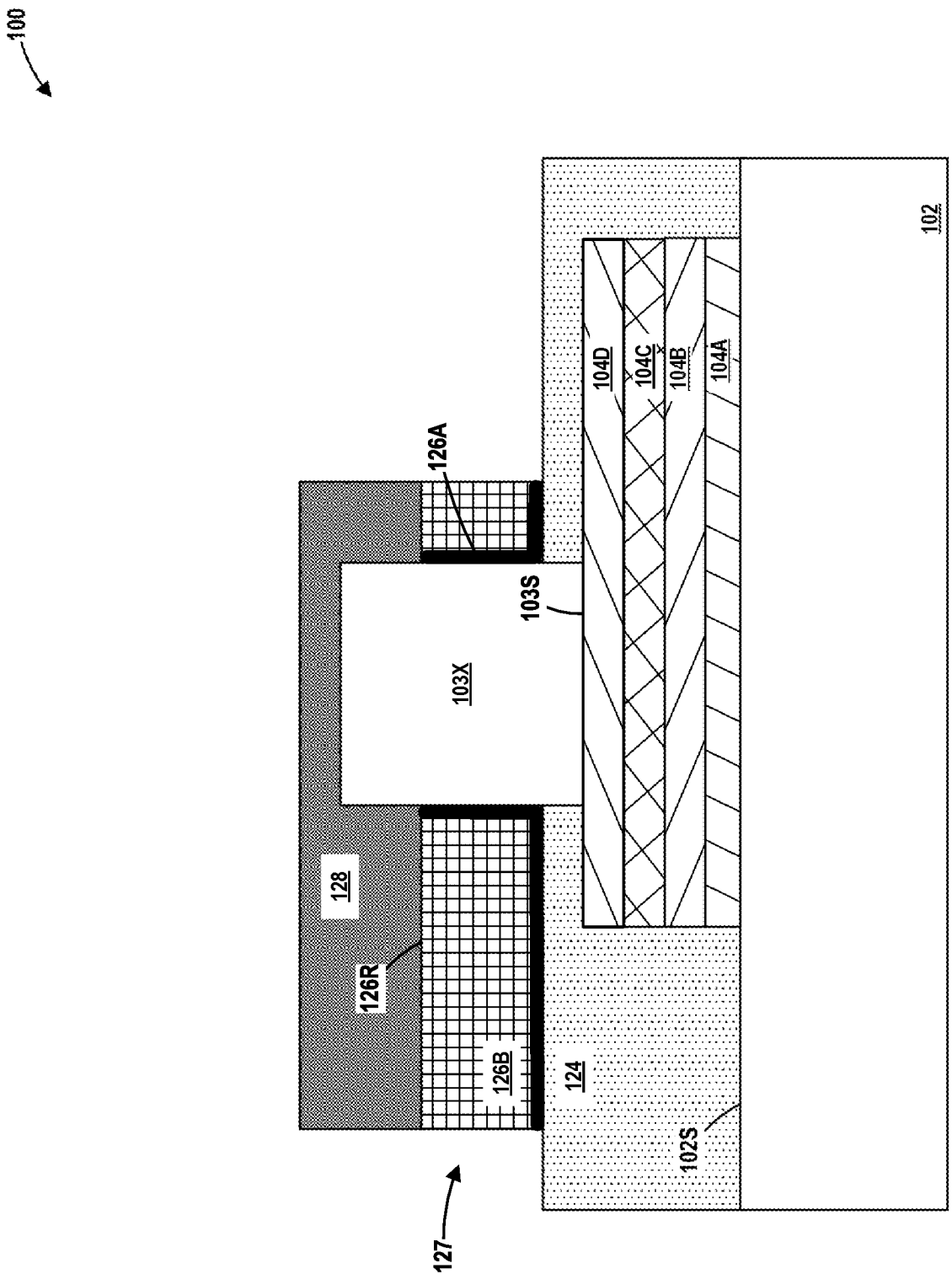

FIG. 11 depicts the vertical transistor device 100 after several process operations were performed. First a patterned etch mask 128 was formed to permit patterning the materials 126B, 126A to thereby define the final gate structure 127 for the vertical transistor device 100. The patterned etch mask 128 may be made of any desired material, e.g., OPL, and it may be formed using traditional techniques. Thereafter, one or more anisotropic etching processes were performed through the patterned etch mask to remove the exposed portions of the materials 126A, 126B to form the final gate structure 127. As depicted, a portion of the final gate structure 127 is positioned all around the outer perimeter of a portion of the vertical height of the substantially vertically oriented substrate structure 103X.

Figure 12:
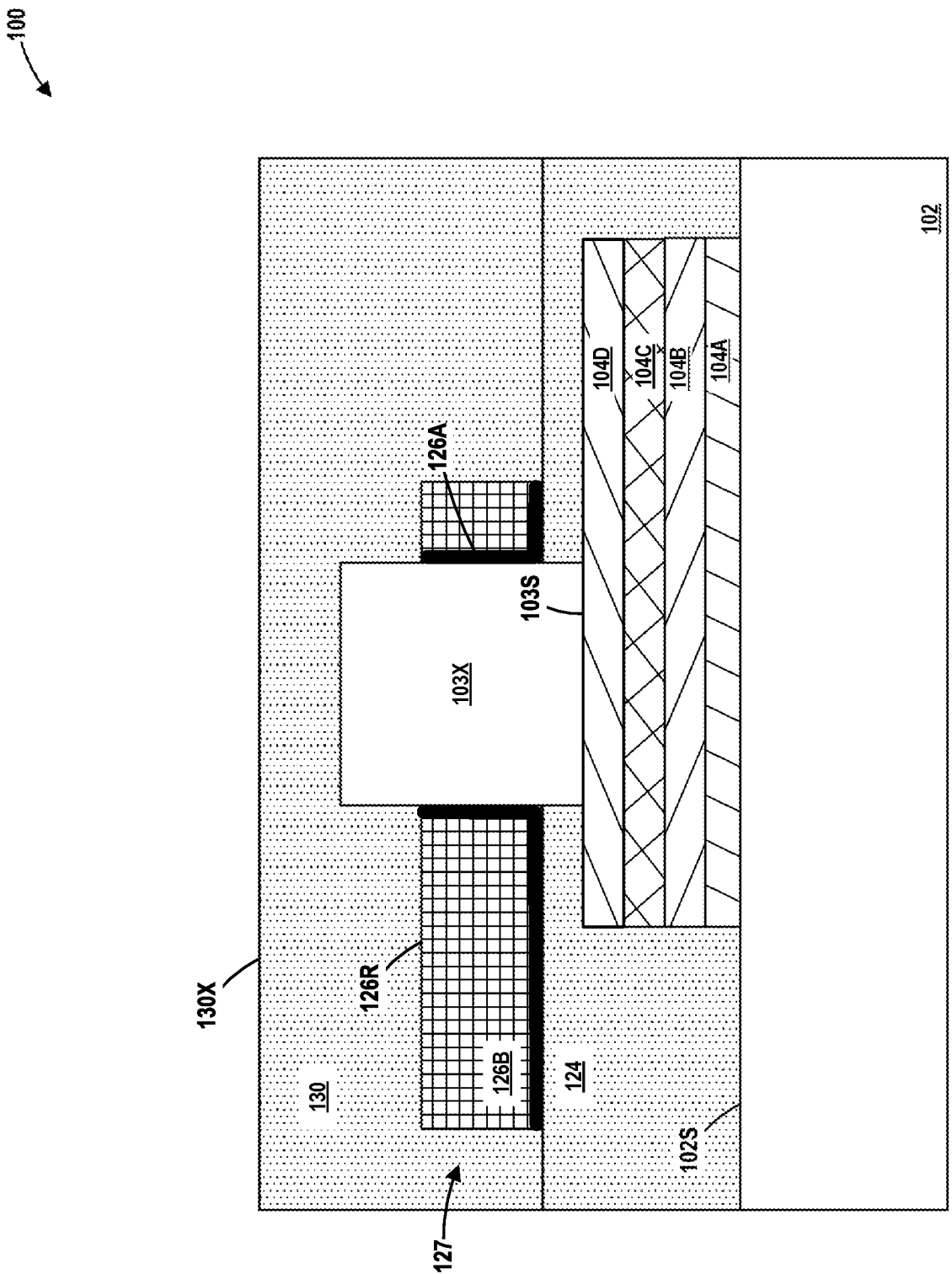

FIG. 12 depicts the vertical transistor device 100 after a layer of insulating material 130 was formed on the product and after its upper surface 130X was planarized by performing a CMP process. The layer of insulating material 130 may be comprised of a variety of different materials, e.g., silicon nitride, a low-k insulating material (k value of 7 or less), silicon dioxide, etc.

Figure 13:
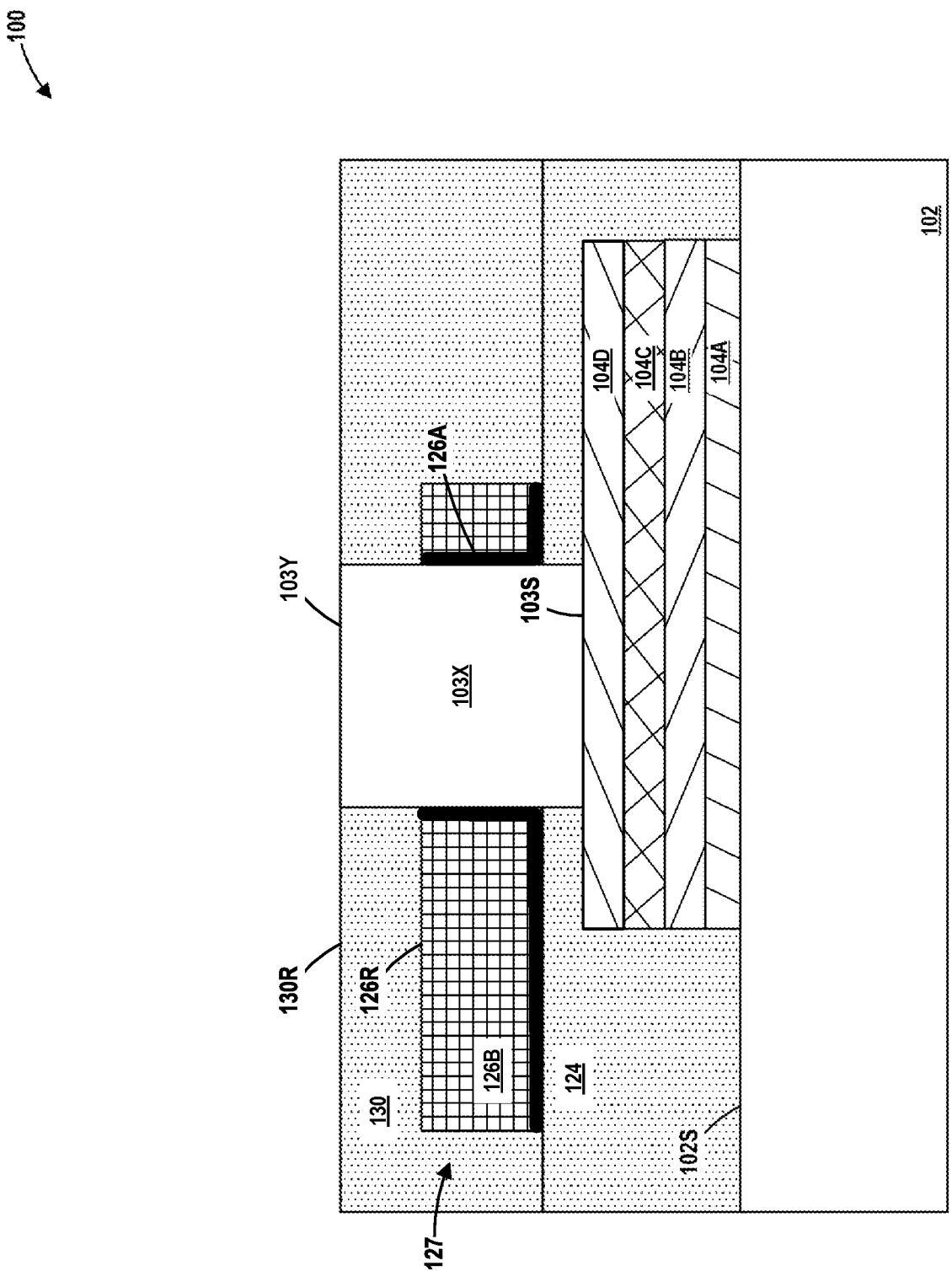

FIG. 13 depicts the vertical transistor device 100 after a timed recess etching process was performed to recess the layer of insulating material 130 to a desired residual vertical thickness. A portion of the recessed layer of insulating material 130 will function as an upper or top spacer for the vertical transistor device 100. After this etching process is performed, the recessed layer of insulating material 130 has a recessed upper surface 130R. Note that this process operation also exposed the upper surface 103Y of the substrate structure 103X.

Figure 14:
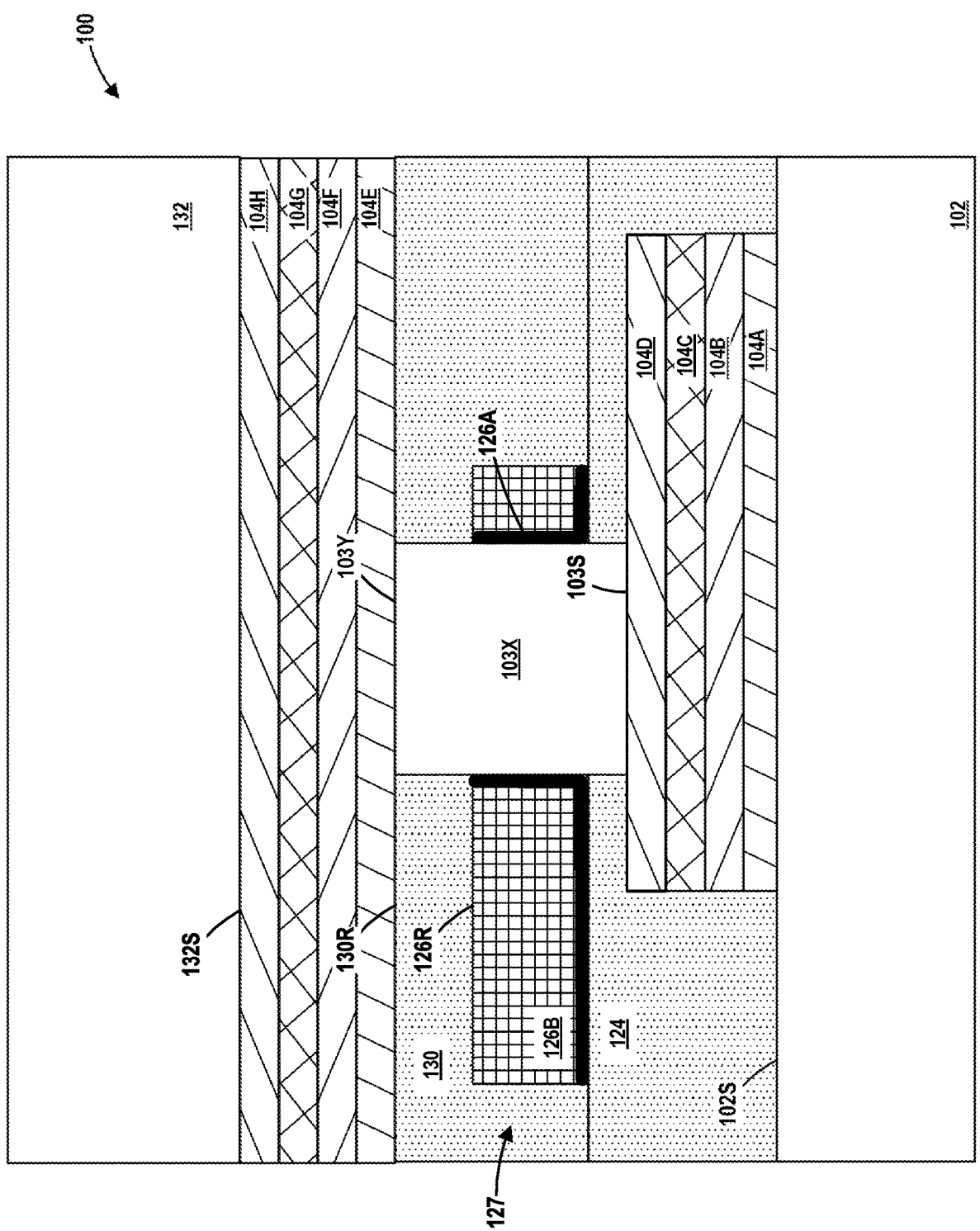

FIG. 14 depicts the vertical transistor device 100 after a third semiconductor substrate 132 with a plurality of 2D material layers 104E-104H was positioned on and bonded to the recessed upper surface 130R of the layer of insulating material 130 and the upper surface 103Y of the substrate structure 103X. More specifically, the lowermost 2D material layer 104E on the substrate 132 is positioned on and bonded to the recessed upper surface 130R of the layer of insulating material 130 and to the upper surface 103Y of the substrate structure 103X. The 2D material layers 104E-104H will also be collectively referenced using the numeral 104 and they may have the same physical characteristics and material composition of the previously described 2D material layers 104A-104D, but that may not be the case in all applications. The number of the 2D material layers 104E-104H formed on the substrate 132 may vary depending upon the particular application, and the number of 2D material layers 104E-104H formed on the substrate 132 need not be the same as the number of 2D material layers 104A-104D formed on the substrates 102, 103, but that may be the case in some applications. In other applications, only a single 2D material layer 104 may be formed on the substrate 132.

The substrate 132 may have a bulk configuration (as depicted in FIG. 14) or a semiconductor-on-insulator or silicon-on-insulator (SOI) configuration (not shown) that includes a base semiconductor layer, a buried insulation layer (e.g., silicon dioxide), and an active layer (e.g., silicon), wherein semiconductor devices are formed in and above the active layer. The substrate 132 may be made of silicon or it may be made of semiconductor materials other than silicon and they may be formed to any desired thickness. Additionally, the substrates 102, 103, 132 need not be made of the same material or have the same thickness, but that may the case in some applications.

Figure 15:
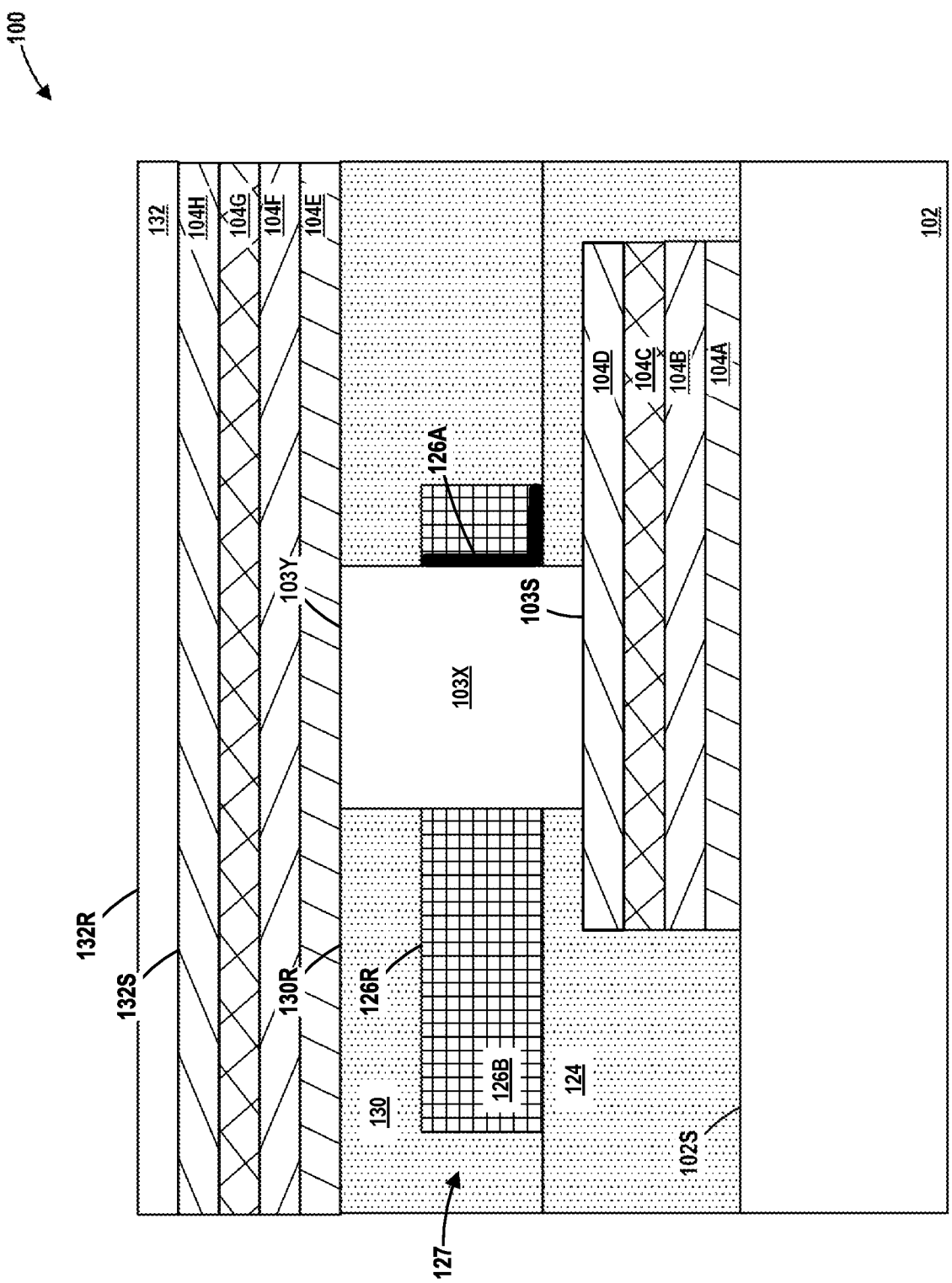

FIG. 15 depicts the vertical transistor device 100 after a thinning process was performed to reduce the thickness of the substrate 132. The thinning operation may be performed by performing an etching process or a CMP process or a combination of such processes. After this thinning process is performed, the thinned substrate 132 has a recessed upper surface 132R. The final vertical thickness of the thinned substrate 132 may vary depending upon the particular application.

Figure 16:
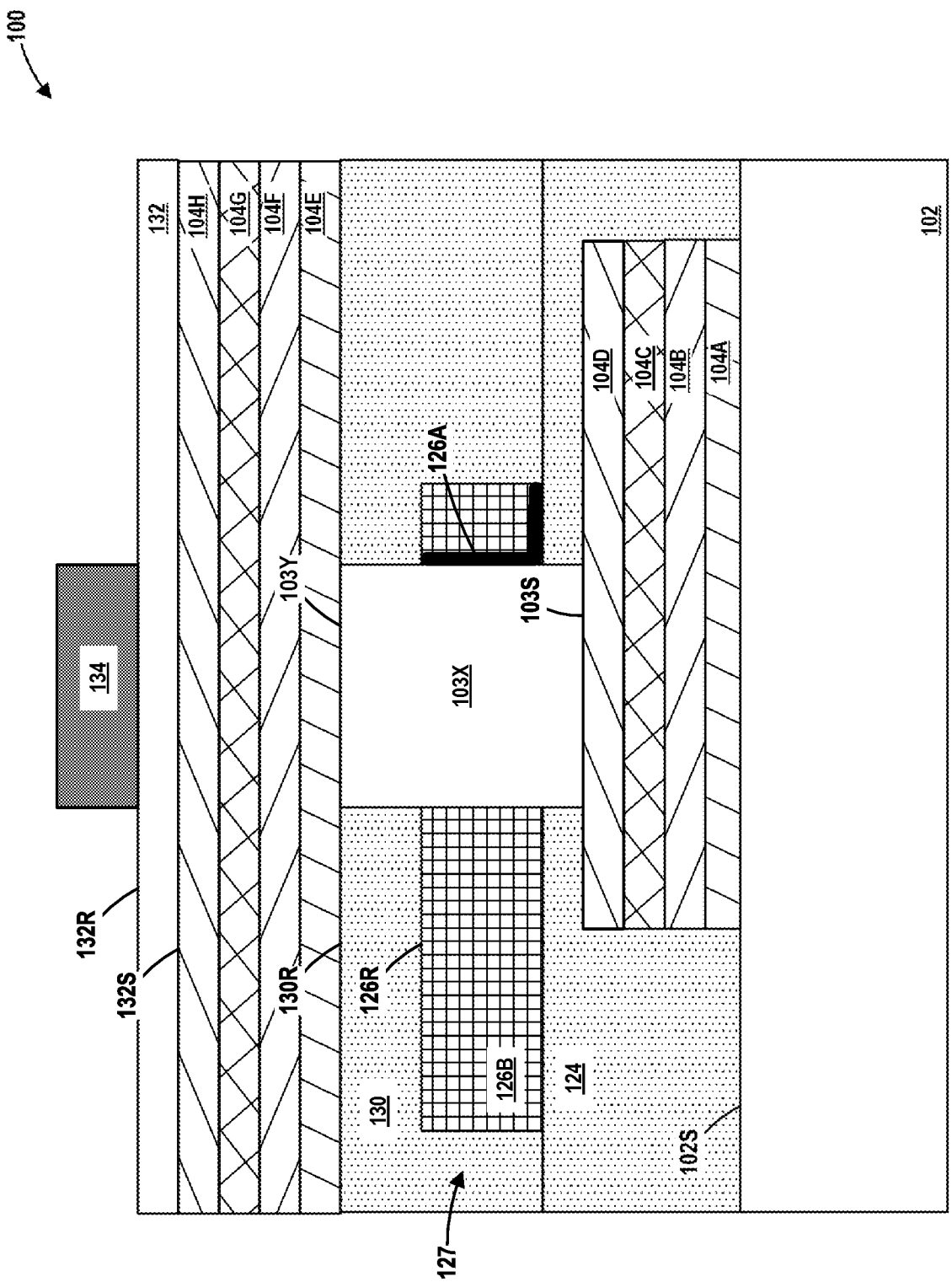

FIG. 16 depicts the vertical transistor device 100 after a patterned etch mask 134 was formed above the thinned substrate 132. In one illustrative example, the patterned etch mask 134 may be a patterned layer of photoresist or OPL. In other applications, the patterned etch mask 134 may be a patterned hard mask that is comprised of, for example, silicon nitride. Such a patterned hard mask may be formed by performing known deposition, masking and etching techniques.

Figure 17:
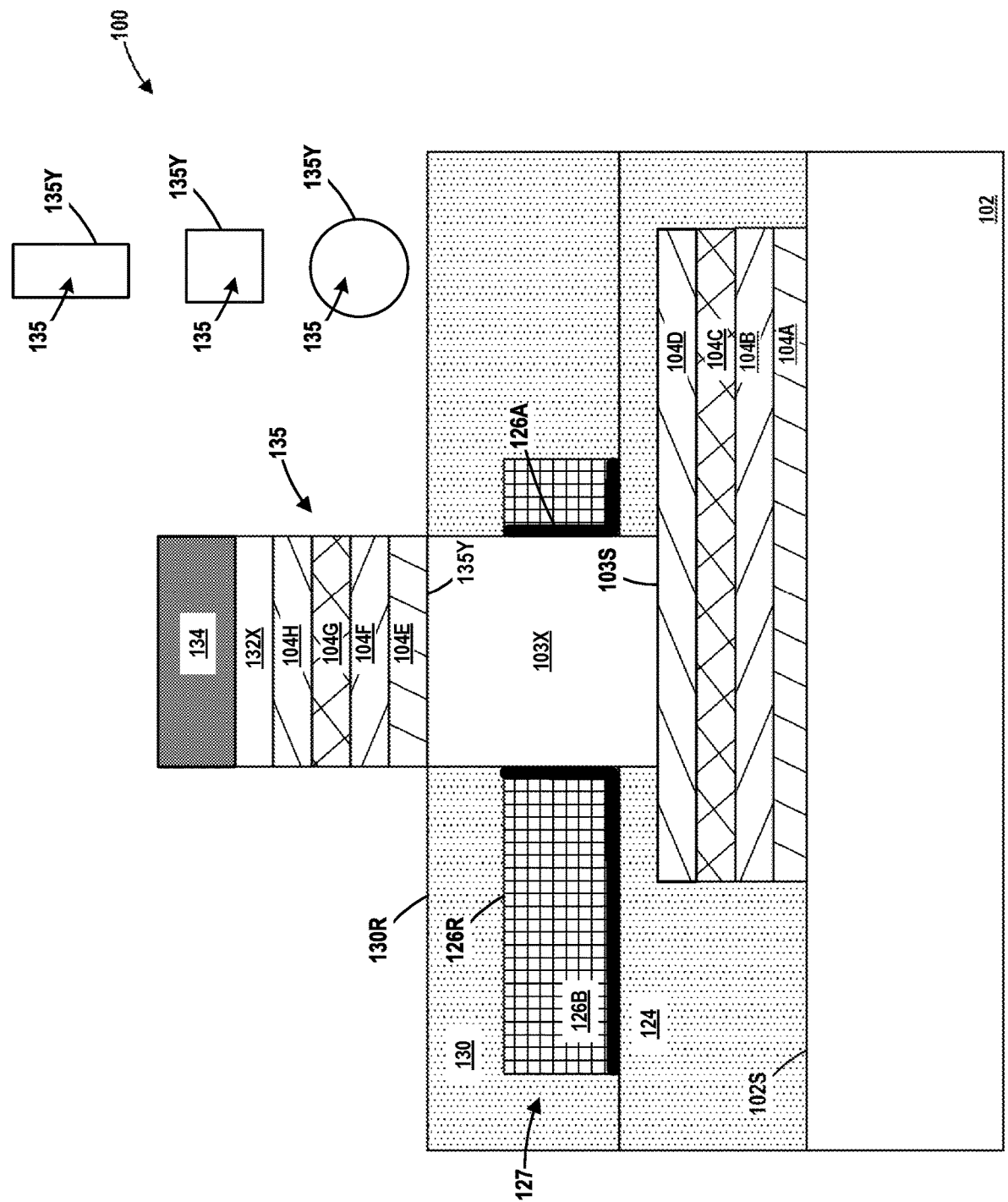

FIG. 17 depicts the vertical transistor device 100 after one or more etching processes were performed through the patterned etch mask 134 to pattern the thinned substrate 132 and the 2D material layers 104E-H. This results in the formation of substrate feature 132X. In some applications, the substrate feature 132X may be completely removed. As will be appreciated by those skilled in the art after a complete reading of the present application, the patterned 2D material layers 104E-H will become the at least a portion of the upper or top source/drain region 135 for the vertical transistor device 100. As indicated in the right-hand portion of FIG. 17, when viewed from above, the top source/drain region 135 (i.e., the patterned 2D material layers 104E-H) as well as the substrate feature 132X may have a variety of different configurations, e.g., circular, rectangular, square, etc., and the top source/drain region 135 has an outer perimeter 135Y. In one illustrative process flow, when viewed from above, the configuration of the top source/drain region 135 may substantially match the configuration of the substantially vertically oriented substrate structure 103X.

Figure 18:
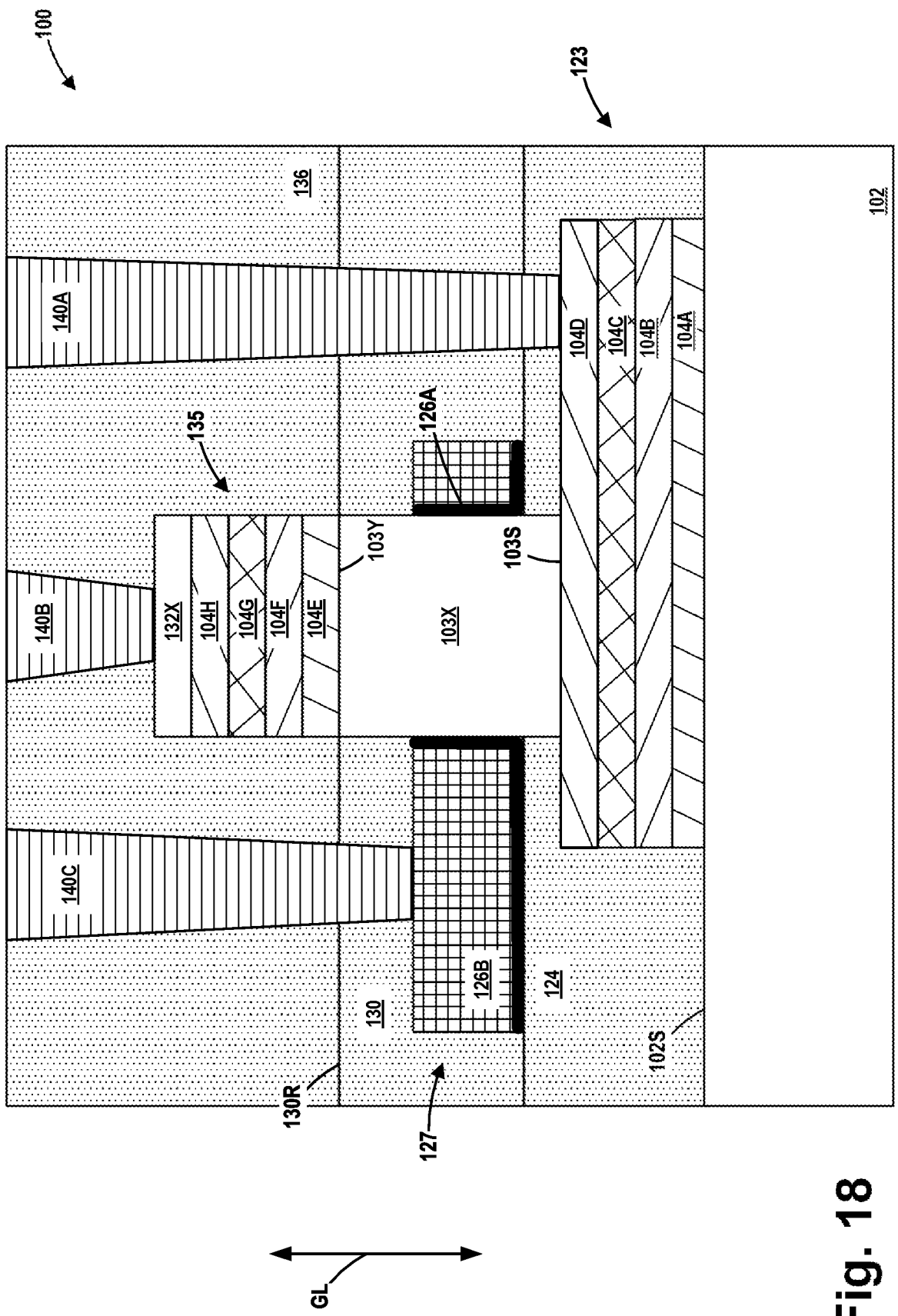

FIG. 18 depicts the vertical transistor device 100 after several process operations were performed. First, a representative one or more layers of insulating material 136 were formed above the layer of insulating material 130. As will be appreciated by those skilled in the art, the one or more layers of insulating material 136 is intended to be representative of any of a variety of combinations of insulating materials and etch stop layers. The one or more layers of insulating material 136 may comprise a variety of different materials, e.g., silicon dioxide, a low-k material, silicon nitride, etc. and these layers of material may be formed to any desired thickness. Next, known manufacturing techniques were performed to form a bottom source/drain contact structure 140A, a top source/drain contact structure 140B and a gate contact structure 140C (collectively referenced using the numeral 140) in the one or more layers of insulating material 136. The contact structures 140 are intended to be schematic and representative in nature, as they may be formed using any of a variety of different conductive materials and by performing traditional manufacturing operations. The contact structures 140 may also contain one or more barrier layers (not depicted). In one illustrative example, the contact structures 140 may be formed by forming contact openings in the various insulating material layers 136 to expose the desired landing point for the contact, and thereafter depositing a liner, e.g., Ti, TiN, in the contact openings. Then, a deposition process may be performed so as to overfill the contact openings with a conductive material, such as tungsten or cobalt. Thereafter, a CMP process may be performed to planarize the upper surface of the layer of insulating material 136, which results in the removal of excess portions of the liner and the tungsten (or cobalt) positioned above the layer of insulating material 136 outside of the contact openings and the formation of the contact structures 140.

With continuing reference to FIG. 18, note that, in the example depicted herein, the gate structure 127 has a dimension (i.e., a vertical thickness) in the gate length direction (GL) of the vertical transistor device 100 that less than the overall vertical height of the substantially vertically oriented substrate structure 103X. Also note that, if desired, a first portion of the substantially vertically oriented semiconductor structure 103X positioned vertically between the gate structure 127 and the at least one layer of 2D material 104 in the bottom source/drain region 123 comprises a dopant material and a second portion of the substantially vertically oriented semiconductor structure 103X positioned vertically between the gate structure 127 and the at least one layer of 2D material 104 in the top source/drain region 135 comprises the dopant material. For an N-type device 100, an N-type dopant may be used. For a P-type device 100, a P-type dopant may be used. Such dopant materials, if used, may be introduced into the first and second portions of the substantially vertically oriented semiconductor structure 103X at some point(s) during the manufacturing of the device 100 using techniques known to those skilled in the art.

As described above, the 2D material layers 104 disclosed herein have a periodic crystallographic pattern. In one illustrative embodiment, where the various embodiments of the vertical transistor device 100 disclosed herein comprise at least two of the 2D material layers 104, the periodic crystallographic pattern of vertically adjacent 2D material layers 104 may be rotated or "twisted" relative to one another so as to improve the electrical performance of the combination of the at least two layers of the 2D material 104, such as, for example, charge carrier mobility, gate control, gate capacitance, short channel effects, etc. The amount of or degree of relative rotation between the 2D material layers 104 may be determined with respect to any axis of rotation. For example, such a reference axis of rotation may be a line that is substantially normal to the upper surface 102S of the substrate 102. Other reference axes are, or course possible. Moreover, the direction of relative rotation between the 2D material layers 104 (clockwise or counterclockwise) may vary as well. Of course, depending upon the material selected for the 2D material layers 104, e.g., graphene or $MoS_2$, the periodic crystallographic pattern of the 2D material layers may be different. In FIGS. 19-24, each of the 2D material layers 104 is depicted as being comprised of silicon.

Figure 19:
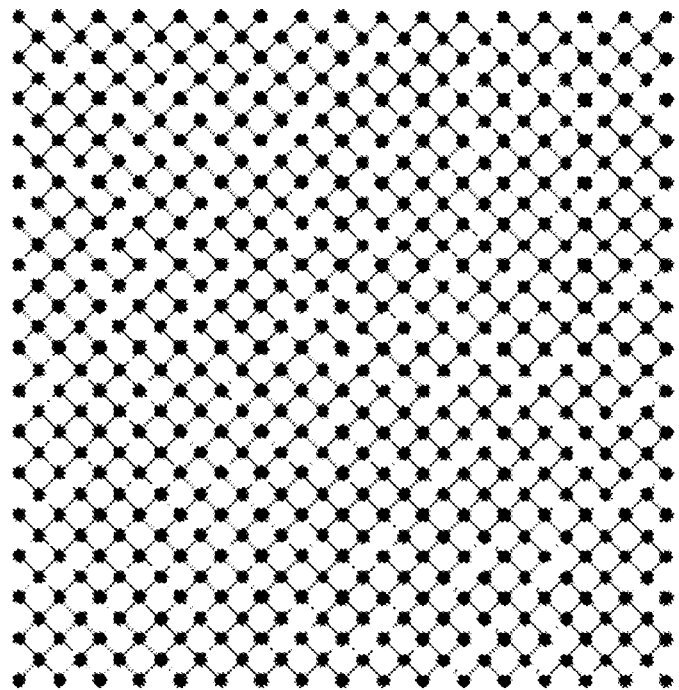

FIG. 19 is a top view of a single layer of 2D material 104 disclosed herein showing the periodic crystallographic pattern of each of the 2D material layers 104.

Figure 20:
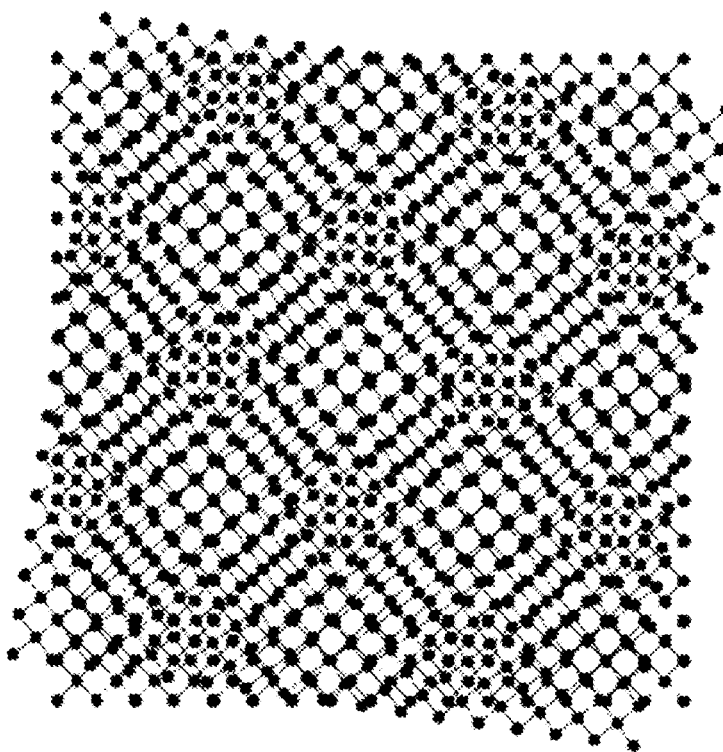

FIG. 20 is a plan view of two of the 2D material layers 104 in a stacked arrangement wherein the uppermost of the two 2D material layers 104 is rotated about 8° in a clockwise direction relative to the bottom layer of the two 2D material layers 104.

Figure 21:
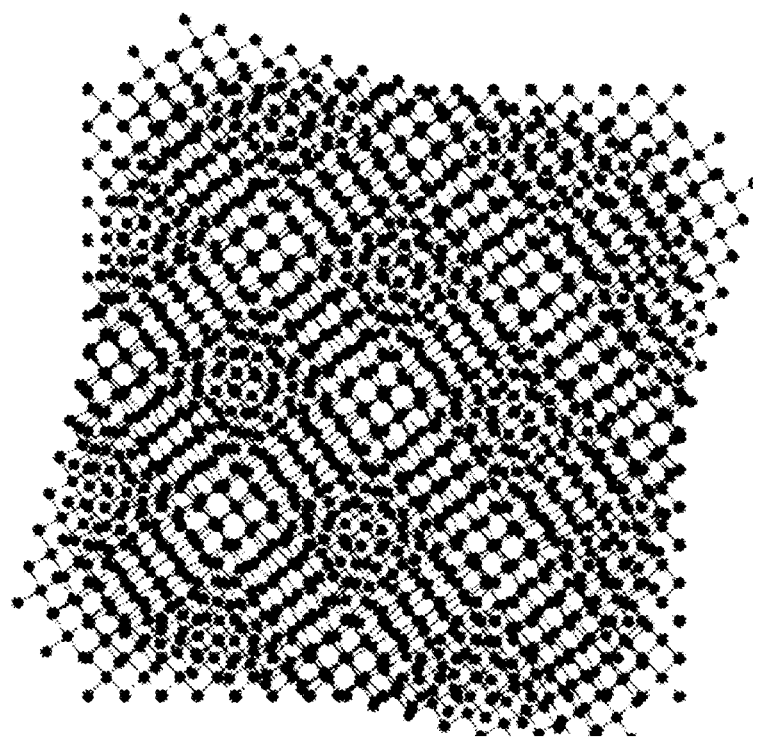

FIG. 21 is a plan view of three of the 2D material layers 104 in a stacked arrangement wherein the second of the three 2D material layers 104 is rotated about 8° in a clockwise direction relative to the bottom layer of the three 2D material layers 104 and the uppermost of the three 2D material layers 104 is rotated about 8° in a clockwise direction relative to the second layer of the three 2D material layers 104. Thus, in relative terms, the uppermost of the three 2D material layers 104 is rotated in a clockwise direction about 16° relative to the bottom layer of the three 2D material layers 104.

Figure 22:
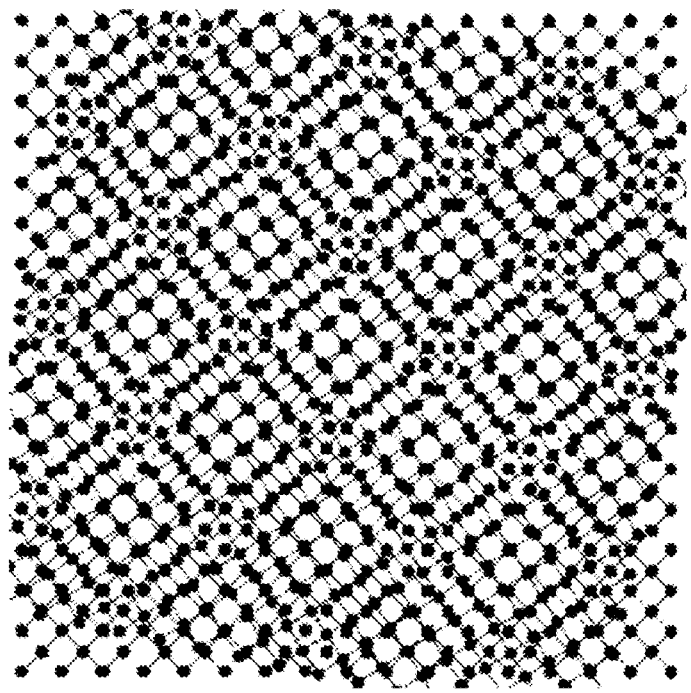

FIG. 22 is a plan view of two of the 2D material layers 104 in a stacked arrangement wherein the uppermost of the two 2D material layers 104 is rotated about 12° in a clockwise direction relative to the bottom layer of the two 2D material layers 104.

Figure 23:
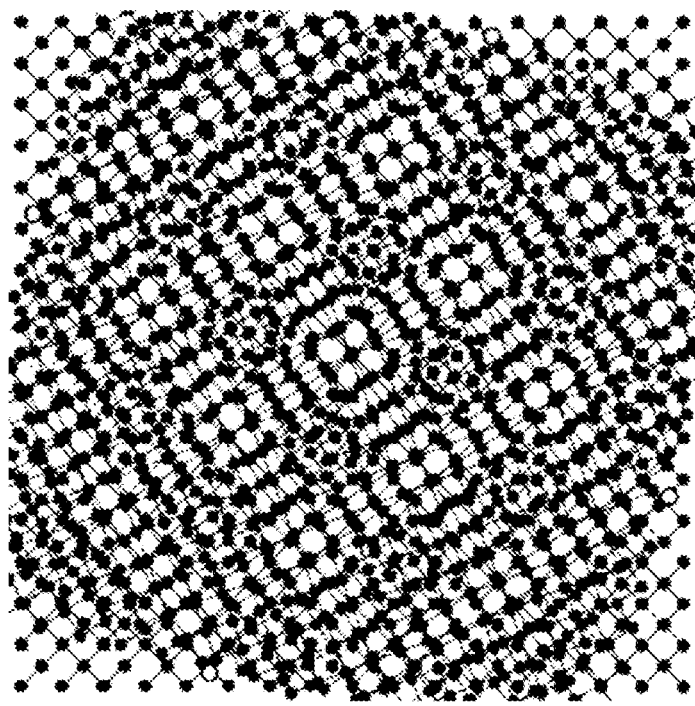

FIG. 23 is a plan view of three of the 2D material layers 104 in a stacked arrangement wherein the second of the three 2D material layers 104 is rotated about 12° in a clockwise direction relative to the bottom layer of the three 2D material layers 104 and the uppermost of the three 2D material layers 104 is rotated about 12° in a clockwise direction relative to the second layer of the three 2D material layers 104. Thus, in relative terms, the uppermost of the three 2D material layers 104 is rotated in a clockwise direction about 24° relative to the bottom layer of the three 2D material layers 104.

Figure 24:
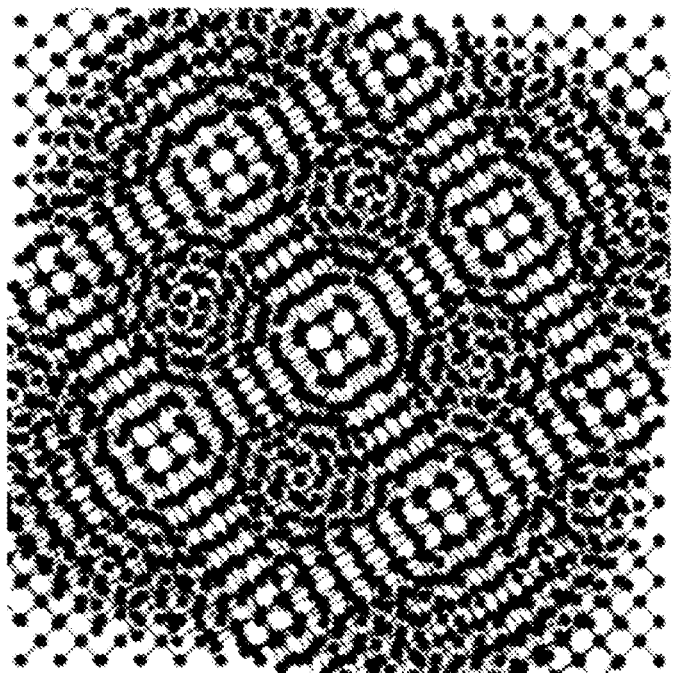

FIG. 24 is a plan view of a stack of the 2D material layers 104 that is similar to that shown in FIG. 21 except that a fourth 2D material layer has been positioned above the uppermost of the three of the 2D material layers 104 shown in FIG. 21, and the fourth layer of 2D material shown in FIG. 24 has been rotated about 8° in a clockwise direction relative to the third layer of the four 2D material layers 104 shown in FIG. 21. Thus, in relative terms, the uppermost of the four 2D material layers 104 shown in FIG. 24 is rotated in a clockwise direction about 24° relative to the bottom layer of the four 2D material layers 104 shown in FIG. 21.

Of course, as will be appreciated by those skilled in the art after a complete reading of the present application, the relative rotation between the 2D material layers 104 need not be constant for all of the 2D material layers 104 in a given stack of such materials. For example, the second layer of a four layer stack of materials may be rotated 7° relative to the bottom layer, the third layer of the stack may be rotated 15° relative to the second layer of the stack of material, and the fourth layer of the stack may be rotated 6° relative to the third layer of the stack of such materials. Additionally, the direction of relative rotation may be different for various layers in the stack of such three 2D material layers. Moreover, in some cases, the direction of relative rotation among all of the 2D material layers within a given stack may be the same, but that may not be the case in all applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A vertical transistor device, comprising:
   a bottom source/drain region including a first plurality of layers of two-dimensional (2D) material, wherein each of the first plurality of layers of 2D material has a respective periodic crystallographic pattern with a respective rotational orientation about a first reference axis of rotation relative to each adjacent layer of the first plurality of layers of 2D material;
   a top source/drain region including a second plurality of layers of 2D material, wherein the top source/drain region is positioned vertically above at least a portion of the bottom source/drain region;
   a vertically oriented semiconductor structure positioned vertically between the bottom source/drain region and the top source/drain region, the vertically oriented semiconductor structure having a vertical height and an outer perimeter; and a gate structure positioned all around the outer perimeter of the vertically oriented semiconductor structure for at least a portion of the vertical height of the vertically oriented semiconductor structure.

2. The vertical transistor device of claim 1, wherein the first and second plurality of layers of 2D material each has a planar upper surface, a planar bottom surface and a uniform vertical thickness, in a gate length direction of the vertical transistor device, across an entirety of the first and second plurality of layers of 2D material.

3. The vertical transistor device of claim 1, wherein a lowermost surface of the vertically oriented semiconductor structure is positioned on and in contact with the first plurality of layers of 2D material of the bottom source/drain region and an uppermost surface of the vertically oriented semiconductor structure is positioned on and in contact with the second plurality of layers of the top source/drain region.

4. The vertical transistor device of claim 1, wherein a first portion of the vertically oriented semiconductor structure positioned vertically between the gate structure and the first plurality of layers of 2D material in the bottom source/drain region comprises a dopant material and a second portion of the vertically oriented semiconductor structure positioned vertically between the gate structure and the second plurality of layers of 2D material in the top source/drain region comprises the dopant material.

5. The vertical transistor device of claim 1, wherein each of the first and second plurality of layers of 2D material comprises a same 2D material.

6. The vertical transistor device of claim 1, wherein each of the first and second plurality of layers of 2D material have a vertical thickness that is the same.

7. The vertical transistor device of claim 1, wherein the first and second plurality of layers of 2D material in each of the bottom source/drain region and the top source/drain region comprises one of silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, or $ReSe_2$.

8. The vertical transistor device of claim 1, wherein the gate structure has a vertical thickness in a gate length direction of the vertical transistor device that is less than the vertical height of the vertically oriented semiconductor structure.

9. The vertical transistor device of claim 1, wherein the first plurality of layers of 2D material positioned in the bottom source/drain region comprise a first number of the layers of 2D material and wherein the second plurality of layers of 2D material positioned in the top source/drain region comprise a second number of the layers of 2D material, wherein the first and second numbers are different.

10. The vertical transistor device of claim 1, wherein each of the first and second plurality of layers of 2D material have a distinct vertical thickness.

11. The vertical transistor device of claim 1, wherein each of the second plurality of layers of 2D material has a respective periodic crystallographic pattern, with a respective rotational orientation about a second reference axis of rotation.

12. A vertical transistor device, comprising:
a bottom source/drain region comprising a first plurality of layers of two-dimensional (2D) material, wherein each of the first plurality of layers of 2D material has a respective periodic crystallographic pattern with a respective rotational orientation about a first reference axis of rotation relative to each adjacent layer of the first plurality of layers of 2D material;

a top source/drain region comprising a second plurality of layers of two-dimensional (2D) material, wherein each of the second plurality of layers of 2D material has a respective periodic crystallographic pattern with a respective rotational orientation about a second reference axis of rotation relative to each adjacent layer of the second plurality of layers of 2D material;

a vertically oriented semiconductor structure positioned vertically between the bottom source/drain region and the top source/drain region, the vertically oriented semiconductor structure having a vertical height and an outer perimeter; and a gate structure positioned all around the outer perimeter of the vertically oriented semiconductor structure for at least a portion of the vertical height of the vertically oriented semiconductor structure.

13. The vertical transistor device of claim 12, wherein a lowermost surface of the vertically oriented semiconductor structure is positioned on and in contact with an uppermost of the first plurality of layers of 2D material of the bottom source/drain region and an uppermost surface of the vertically oriented semiconductor structure is positioned on and in contact with a lowermost second plurality of layers of 2D material of the top source/drain region.

14. The vertical transistor device of claim 12, wherein a first portion of the vertically oriented semiconductor structure positioned vertically between the gate structure and the first plurality of layers of 2D material of the bottom source/drain region comprises a dopant material and a second portion of the vertically oriented semiconductor structure positioned vertically between the gate structure and the second plurality of layers of 2D material of the top source/drain region comprises the dopant material.

15. The vertical transistor device of claim 12, wherein each of the first and second plurality of layers of 2D material comprise a same 2D material.

16. The vertical transistor device of claim 12, wherein the first plurality of layers of 2D material comprises one of silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, or $ReSe_2$, and wherein the second plurality of layers of 2D material comprises one of silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, or $ReSe_2$.

17. The vertical transistor device of claim 15, wherein the first plurality of layers of 2D material comprise a first number of the layers of 2D material and wherein the second plurality of layers of 2D material comprise a second number of the layers of 2D material, wherein the first and second numbers are the same.

18. A vertical transistor device, comprising:
a bottom source/drain region comprising a first plurality of layers of two-dimensional (2D) material, wherein each of the first plurality of layers of 2D material has a respective periodic crystallographic pattern with a respective rotational orientation about a first reference axis of rotation relative to each adjacent layer of the first plurality of layers of 2D material;

a top source/drain region comprising a second plurality of layers of two-dimensional (2D) material, wherein each of the second plurality of layers of 2D material has a respective periodic crystallographic pattern with a respective rotational orientation about a second reference axis of rotation relative to each adjacent layer of the second plurality of layers of 2D material;

a vertically oriented semiconductor structure positioned vertically between the bottom source/drain region and the top source/drain region, the vertically oriented semiconductor structure having a vertical height and an outer perimeter, wherein a lowermost surface of the vertically oriented semiconductor structure is positioned on and in contact with an uppermost of the first plurality of layers of 2D material of the bottom source/drain region and an uppermost surface of the vertically oriented semiconductor structure is positioned on and in contact with a lowermost second plurality of layers of 2D material of the top source/drain region; and a gate structure positioned all around the outer perimeter of the vertically oriented semiconductor structure for at least a portion of the vertical height of the vertically oriented semiconductor structure.

19. The vertical transistor device of claim 18, wherein the first plurality of layers of 2D material comprise a first number of the layers of 2D material and wherein the second plurality of layers of 2D material comprise a second number of the layers of 2D material, wherein the first and second numbers are different.

20. The vertical transistor device of claim 18, wherein the first plurality of layers of 2D material comprises one of silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, or $ReSe_2$.

* * * * *